(12) United States Patent
Mershin et al.

(10) Patent No.: US 8,796,544 B2
(45) Date of Patent: Aug. 5, 2014

(54) BIO-SENSITIZED SOLAR CELLS (BSSC)

(75) Inventors: Andreas Mershin, Cambridge, MA (US); Brian Cook, Somerville, MA (US); Shuguang Zhang, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 2364 days.

(21) Appl. No.: 11/639,372

(22) Filed: Dec. 14, 2006

(65) Prior Publication Data

US 2007/0157967 A1    Jul. 12, 2007

Related U.S. Application Data

(60) Provisional application No. 60/750,185, filed on Dec. 14, 2005.

(51) Int. Cl.
*H01G 9/20* (2006.01)
*H01L 51/42* (2006.01)

(52) U.S. Cl.
USPC .................... 136/263; 136/255; 136/265

(58) Field of Classification Search
CPC ............................................. H01G 9/20
USPC .............................................. 136/263, 252
See application file for complete search history.

(56) References Cited

U.S. PATENT DOCUMENTS

| | | |
|---|---|---|
| 4,215,182 A | 7/1980 | Ang et al. |
| 5,252,719 A | 10/1993 | Takeda et al. |
| 5,897,945 A | 4/1999 | Lieber et al. |
| 6,225,198 B1 | 5/2001 | Alivisatos et al. |
| 6,291,763 B1 * | 9/2001 | Nakamura .................... 136/256 |
| 6,649,824 B1 * | 11/2003 | Den et al. .................... 136/256 |
| 6,949,206 B2 | 9/2005 | Whiteford et al. |
| 7,179,784 B2 | 2/2007 | Zhang et al. |
| 2003/0176335 A1 | 9/2003 | Zhang et al. |
| 2004/0250848 A1 | 12/2004 | Sager et al. |
| 2004/0265550 A1 * | 12/2004 | Glatkowski et al. .......... 428/209 |
| 2005/0009224 A1 | 1/2005 | Yang et al. |
| 2005/0098726 A1 | 5/2005 | Peumans et al. |
| 2005/0255629 A1 | 11/2005 | Han et al. |

OTHER PUBLICATIONS

Entry for "Sandal Wood" from "The American cyclopaedia", G. Ripley and C.A. Dana eds. New York: D. Appleton and Company. 1883. p. 596-597.*
Tennakone, K. et al. "Sensitization of nano-porous films of TiO2 with santalin (red sandalwood pigment) and construction of dye-sensitized solid-state photovoltaic cells." J. Photochem. Photobiol. A. 117, 137-142. (1998).*
Ben-Shem, A. et al. "Crystal structure of plant photosystem I". Nature. 426, 630-635. (2003).*

(Continued)

*Primary Examiner* — Thanh-Truc Trinh
(74) *Attorney, Agent, or Firm* — Elmore Patent Law Group, P.C.; Carolyn S. Elmore; Darlene A. Vanstone

(57) ABSTRACT

The present invention provides a wet or dry bio-sensitized photoelectric conversion device (photodetector or photovoltaic) comprising: a stabilized biologically-derived sensitizer, such as a stablilized photosystem I (PS-I), deposited on nanowires, semiconductor material, electrodes and a support. The nanowires provide a greater surface area of the light absorption layer for better energy conversion efficiency and are chosen such as to complement the absorption spectrum of the sensitizer and protect the sensitizer from photobleaching.

16 Claims, 17 Drawing Sheets

(56) References Cited

OTHER PUBLICATIONS

Lam, K.B. et al. "A MEMS Photosynthetic Electrochemical Cell Powered by Subcellular Plant Photosystems." J. Michroelectromech. Systems. 15, 1243-1250. (2006).*

Das et al., "Integration of Photosynthetic Protein Molecular Complexes in Solid-State Electronic Devices," Nanoletters,, 4(6):1079-1083 (2004).

Xu et al., "Simple approach to highly oriented ZnO nanowire arrays: large-scale growth, photoluminescence and photocatalytic properties," Nanotechnology,17:588-594 (2006).

Thai et al., "Identification and characterization of Cu2O- and ZnO-binding polypeptides by *Escherichia coli* cell surface display: toward an understanding of metal oxide binding," Biotechnol. Bioeng., 87(2):129-137 (2004).

* cited by examiner (a)

(b)

Subunit design

EAHVMHKVAPRP  pI 8.9 → [ZnO tag]–Gly5 linker–PsaD (18 kDa)–Gly5 linker–His6   ZnO-E-PsaD RIGHGRQIRKPL  pI 12.3 → [ZnO tag]–Gly5 linker–PsaD (18 kDa)–Gly5 linker–His6   ZnO-R-PsaD

FIG. 3B

BIO-SENSITIZED SOLAR CELLS (BSSC)

RELATED APPLICATION

This application claims the benefit of U.S. Provisional Application No. 60/750,185 filed on Dec. 14, 2005. The entire teaching of the above application is incorporated herein by reference.

GOVERNMENT SUPPORT

This invention was made with government support under grant number F49620-03-1-0365 awarded by the Air Force. The government has certain rights in this invention.

BACKGROUND OF THE INVENTION

Photovoltaic power generation systems are now being commercially introduced and coming into widespread use. A solar cell utilizing a semiconductor junction of silicon, gallium arsenide or the like is generally known as a method of converting light energy into electric energy. A crystal silicon solar cell, a polycrystalline silicon solar cell utilizing a p-n junction of a semiconductor, and an amorphous silicon solar cell utilizing a p-i-n junction of a semiconductor have all been developed for practical applications. However, the production cost of silicon solar cells is relatively high and much energy is consumed in the process. Thus, in order for these solar cells to be cost effective it becomes necessary to use them for a long duration. These high costs prevent the wide use of silicon solar cells today. Solar cells using CdTe and CuIn(Ga)Se have also been studied. However, environmental pollution and resource consumption are serious constraints in their large-scale deployment.

In addition to those dry type solar cells, a wet type solar cell utilizing a photoelectric chemical reaction caused in the interface of a semiconductor and an electrolytic solution has also been studied. A metal oxide semiconductor such as titanium oxide, tin oxide, or the like has the advantage of lowering solar-cell manufacturing costs as compared to silicon, gallium arsenide, or the like. Above all, titanium oxide and zinc oxide are excellent in both photoelectric conversion efficiency in the ultraviolet region and photochemical stability. But, when used alone, semiconductors such as titanium oxide and zinc oxide (having a wide band gap not less than 3 eV) absorb poorly outside the ultraviolet range of the spectrum and therefore the photoelectric conversion is inefficient.

The cost of biologically-derived light harvesting components has commercial potential because of the wide availability and ease of directed growth of plants, seaweed, algae and bacteria including thermophilic organisms.

The first truly bio sensitized photovoltaic cell was reported by Das et al. (*Nanoletters*, 2004, 1079-1083) using photosystem I (PS-I) or the bacterial reaction center (RC), but with very low efficiencies and lifetimes. Das et al. (incorporated herein by reference) described the photovoltaic devices using a self-assembled monolayer of $Ni^{2+}$-NTA on transparent and conductive indium-tin oxide (ITO)-coated glass. The photosynthetic components are oriented via selective binding with polyhistidine tags present on each complex. However, the device suffers from a very low efficiency.

Notwithstanding the recent advances in photoelectronic devices, the need for more efficient photovoltaic cells at a lower cost of production still exists.

SUMMARY OF THE INVENTION

The present invention provides both dry and wet bio sensitized photoelectric conversion devices comprising: a stabilized protein-based sensitizer derived from either plant photosystem I (PS-I), bacterial reaction centers (RC), bacteriorhodopsin (bR) or other plant, algae or bacterial-derived photosynthetic protein deposited on nanowires, semiconductor material, electrodes and a support. The nanowires provide a greater surface area for the light absorption layer and thus increase energy conversion efficiency.

DETAILED DESCRIPTION OF THE INVENTION

Figure 1:
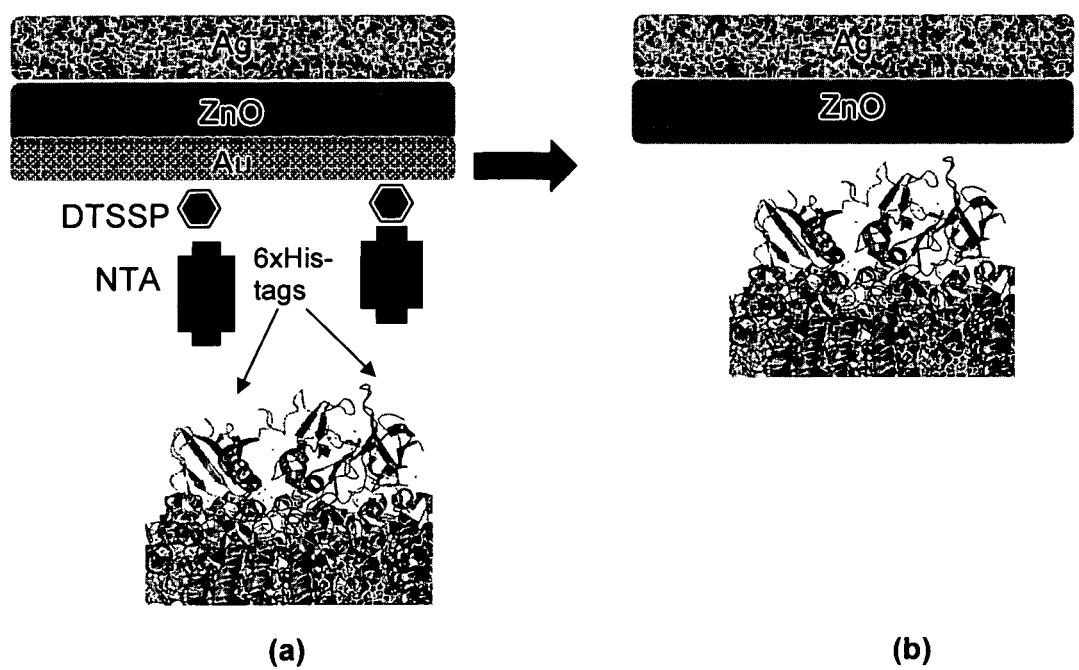
FIGS. 1(a) and (b) depict two different methods for self-assembling stabilized PS-I onto metal oxides.

The present invention features a bio-sensitized photoelectronic conversion device comprising a stabilized biologically-derived sensitizer, such as stabilized proteins or photosystems, on nanowires. The nanowires are used to increase the surface area of the light absorption layer for improved light conversion efficiency.

In one instance of the invention, the photoelectronic device comprises a self-assembled stabilized photosystem I (PS-I) on metal oxide nanowires, semiconductor material, electrodes and a support.

The stabilized photosystem (PS) of the invention comprises self-assembled photosystem stabilized by surfactant peptides. The photosystems can preferably be a photosystem I (PS-I) [or photosystem II (PS-II) if hydrogen-production is desired] that has been isolated from an organism. The PS-I or PS-II-containing units used in accordance with the present invention will preferably comprise isolated thylakoids, PS-I or PS-II particles prepared, for example, from chloroplasts. Methods for the isolation and preparation of thylakoids, PS-I and PS-II particles are well known in the art (see, for example, Boardman, *Methods Enzymol.*, 23:268 1971; Setif et al., *Photosynth. Res.*, 1:17, 1980; Reeves and Hall, *Methods Enzymol.*, 69:85-94, 1980, which are incorporated herein by reference). Other PS-containing units or photoelectron pumping units may also be used. For example, the PS-containing unit may comprise a combination of photosynthetic and/or other cellular or non-cellular components that absorb photons and produce electrons. The PS-containing unit, at the phrase is used in the context of this invention, may include other electron pumping cellular machineries from plant or non-plant organisms and include biological photochromic units from bacterial light-sensitive proteins, bacterial reaction centers (RC), bacteriorhodopsin, photocatalytic microorganisms, and algae. Of particular interest is to use PS-containing units (proteins) derived from extreme thermophiles, such as bacteriorhodopsin, to afford greater thermal stability.

PS-I is the preferred photosystem and is a protein-chlorophyll complex that is part of the photosynthetic machinery within the thylakoid membrane. It is generally ellipsoidal in shape and has dimensions of about 5 by 6 nanometers. The photosystem I reaction center/core antenna complex preferably contains about 40 chlorophylls or more per photoactive reaction center pigment (P700). The chlorophyll molecules serve as antennae which absorb photons and transfer the photon energy to P700, where this energy is captured and utilized to drive photochemical reactions. In addition to the P700 and the antenna chlorophylls, the PS-I complex contains a number of electron acceptors. An electron released from P700 is transferred to a terminal acceptor at the reducing end of PS-I through intermediate acceptors, and the electron is transported across the thylakoid membrane.

The invention can use a thylakoid membrane (or PS containing portions thereof) or an isolated protein-chlorophyll complex of the thylakoid membrane. In one embodiment, native PS-I can be mixed with recombinant 6xHis-tagged psaD subunit or buffer control for about an hour. The mixture can be subjected to ultra centrifugation at 150,000 g on a sucrose gradient to separate free psa subunits. The PS-I can then be removed and subjected to dialysis against a Tris-Triton X-100 buffer. Other isolation techniques can be used as well, including additional/alternate tags or binding peptide sequences which can be engineered onto the photosystem itself or one of its subunits for exchange.

The photosystem is preferably stabilized. Stabilization can be accomplished by mixing the photosystem with a surfactant. A preferred class of surfactants is protein stabilizing surfactants, such as surfactant peptides. The surfactants of the present invention preferably self-assemble in solution. The surfactant, together with the photosystem, form a new self-assembled nanostructure. The surfactants are amphiphilic molecules that tend to aggregate in order to isolate the hydrocarbon chain from the contact with water. The common feature for this self-association is the formation of a polar interface, which separates the hydrocarbon and water regions, in many instances, forming a spherical micelle consisting of typically 50-100 lipid molecules arranged so that their hydrocarbon tails form the interior of the micelle, and the polar head groups act as a shield against the surrounding water. Depending on the surfactant and its concentration, various structures can be found, including liposomes, lamellar phase, hexagonal, cubic or tubular structures. The stabilized photosystem is preferably deposited on nanowires of the present invention (A, referring to FIG. 2).

The surfactant peptides used in accordance with the present invention will be preferably peptides having a formula selected from the group consisting of:

| Sequence (N → C) | Formula |
|---|---|
| $(\phi)_m(+)_n$ | 1 |
| $(+)_n(\phi)_m$ | 2 |
| $(\phi)_m(-)_n$ | 3 |
| $(-)_n(\phi)_m$ | 4 |
| $(-)_n(\phi)_m(-)_n$ | 5 |
| $(+)_n(\phi)_m(+)_n$ | 6 |
| $(\phi)_m(-)_n(\phi)_m$ | 7 |
| $(\phi)_m(+)_n(\phi)_m$ | 8 |
| $(+)_n(\phi)_m(-)_n$ | 9 |
| $(-)_n(\phi)_m(+)_n$ | 10 | wherein:

($\Phi$) represents independently for each occurrence a natural or non-natural amino acid comprising a hydrophobic sidechain; preferably alanine, valine, leucine, isoleucine or proline;

(+) represents independently for each occurrence a natural or non-natural amino acid comprising a sidechain that is cationic at physiological pH; preferably histidine, lysine or arginine;

(−) represents independently for each occurrence a natural or non-natural amino acid comprising a sidechain that is anionic at physiological pH; preferably aspartic acid or glutamic acid;

wherein the terminal amino acids are optionally substituted;

m for each occurrence represents an integer greater than or equal to 5; and n for each occurrence represents an integer greater than or equal to 1;

under conditions suitable for self-assembly of the peptides into a nanostructure and allowing the nanostructure to be formed.

In one aspect the peptides having the formula 1, 3, 4, 5, 7, 8, or 10 and the N terminal amino acid can be substituted by an acyl (e.g. acetyl or butyloxycarbonyl group) or other blocking group to remove the terminal charge and the peptides have the formula 1, 2, 4, 6, 7, 8, or 10 and the C terminal amino acid can be substituted by an amino or alcohol group to form an amide or ester, or other blocking group to remove the terminal charge. Blocking groups that can be used to control charge, hydrophobicity or the ability to self-assemble in the surfactant include esters and amides of carboxylic acids, silyl ethers of alcohols, and acetals and ketals of aldehydes and ketones, respectively. The field of protecting group chemistry has been reviewed (Greene, T. W.; Wuts, P. G. M. Protective Groups in Organic Synthesis, 2nd ed.; Wiley: N.Y., 1991), which is incorporated by reference.

Most preferably, the surfactant peptide is selected from:

AAAAAAD, (SEQ ID NO.1)

VVVVVVD, (SEQ ID NO.2)

AAAAAADD, (SEQ ID NO.3)

VVVVVVDD, (SEQ ID NO.4)

LLLLLLDD, (SEQ ID NO.5)

KKIIIIII, (SEQ ID NO.6)

KKLLLLLL, (SEQ ID NO.7)

KKAAAAAA, (SEQ ID NO.8)

KKVVVVVV, (SEQ ID NO.9)

DDDDDDDDDDAAAAAAAAAA, (SEQ ID NO.10)

AAAAAAAAAADDDDDDDDDD, (SEQ ID NO.11)

-continued

```
EEEEEEEEEEAAAAAAAAAA,          (SEQ ID NO.12)
AAAAAAAAAAEEEEEEEEEE,          (SEQ ID NO.13)
DDDDDDDDDDVVVVVVVVVV,          (SEQ ID NO.14)
VVVVVVVVVVDDDDDDDDDD,          (SEQ ID NO.15)
DDDDDDDDDDPPPPPPPPPP,          (SEQ ID NO.16)
PPPPPPPPPPDDDDDDDDDD,          (SEQ ID NO.17)
AAAAAAAAAAHHHHHHHHHH,          (SEQ ID NO.18)
HHHHHHHHHHAAAAAAAAAA,          (SEQ ID NO.19)
KKKKKKKKKKAAAAAAAAAA,          (SEQ ID NO.20)
AAAAAAAAAAKKKKKKKKKK,          (SEQ ID NO.21)
RRRRRRRRRRAAAAAAAAAA,          (SEQ ID NO.22)
AAAAAAAAAARRRRRRRRRR,          (SEQ ID NO.23)
DDDDDDDDDDAAAAAAAAAADDDDDDDDDD, (SEQ ID NO.24)
EEEEEEEEEEAAAAAAAAAAEEEEEEEEEE, (SEQ ID NO.25)
DDDDDDDDDDVVVVVVVVVVDDDDDDDDDD, (SEQ ID NO.26)
DDDDDDDDDDPPPPPPPPPPDDDDDDDDDD, (SEQ ID NO.27)
HHHHHHHHHHAAAAAAAAAAHHHHHHHHHH, (SEQ ID NO.28)
KKKKKKKKKKAAAAAAAAAAKKKKKKKKKK, (SEQ ID NO.29)
RRRRRRRRRRAAAAAAAAAARRRRRRRRRR, (SEQ ID NO.30)
AAAAAAAAAADDDDDDDDDDAAAAAAAAAA, (SEQ ID NO.31)
AAAAAAAAAAEEEEEEEEEEAAAAAAAAAA, (SEQ ID NO.32)
VVVVVVVVVVDDDDDDDDDDVVVVVVVVVV, (SEQ ID NO.33)
PPPPPPPPPPDDDDDDDDDDPPPPPPPPPP, (SEQ ID NO.34)
AAAAAAAAAAHHHHHHHHHHAAAAAAAAAA, (SEQ ID NO.35)
AAAAAAAAAAKKKKKKKKKKAAAAAAAAAA, (SEQ ID NO.36)
AAAAAAAAAARRRRRRRRRRAAAAAAAAAA, (SEQ ID NO.37)
KKKKKKKKKKAAAAAAAAAADDDDDDDDDD, (SEQ ID NO.38)
KKKKKKKKKKAAAAAAAAAAEEEEEEEEEE, (SEQ ID NO.39)
RRRRRRRRRRVVVVVVVVVVDDDDDDDDDD, (SEQ ID NO.40)
KKKKKKKKKKPPPPPPPPPPDDDDDDDDDD, (SEQ ID NO.41)
and
HHHHHHHHHHAAAAAAAAAAEEEEEEEEEE. (SEQ ID NO.42)
```

Further discussion on the surfactant oligopeptides and di- and tri-block peptide copolymers can be found in US Publication No. 2003/0176335, and is hereby incorporated by reference.

The self-assembled stabilized photosystem must be attached to the metal oxide nanowires. The stabilized photosystem can be bound to the nanowire covalently or non-covalently through the photosystem (or subunits thereof) or through the surfactant or other organic/inorganic intermediates (adapters). Direct attachment (where photosystem directly contacts the metal oxide nanowire surface) and indirect attachment (where intermediate layers are required for attachment) are included. In the context of this invention, methods of attachment of photosystems (such as plant photosystem I (PS-I), bacterial reaction centers (RC), bacteriorhodopsin (bR) or other plant, algae or bacterial-derived photosynthetic protein) to the metal oxide nanowires include, but are not limited to, covalent chemical coupling, photochemical cross-linking, surface coating/modification, gold surface chemistry, protein affinity tags, biotin-streptavidin linkages, antibody immobilization, and engineered surface-binding peptide sequences.

One indirect method is discussed by Das et al. (*Nanoletters*, 2004, 1079-1083) wherein the use of $Ni^{2+}$-NTA on Au with Cr as the adhesion promoter (FIG. 1A) binds the stabilized PS-I through a 6xHistadine tag to the nanowire (shown here as a ZnO layer, which is not drawn to scale).

Another method is the direct attachment of the self-assembled photosystem on metal oxides using peptide binding sequences. For example, in the case of ZnO nanowires as shown in FIG. 1B, the self-assembled PS-I can be directly attached to ZnO nanowires using a ZnO-binding peptide sequence. These binding peptide sequences are obtained by screening a vast combinatorial library of random peptide sequences for binding to the metal oxide surface. To allow binding sequences to be enriched, the peptides are coupled to a biological vector. Some examples are viruses (phage display), cell surface display (using bacteria or yeast), or small biomolecules (ribosomes or antibodies). For a review of these methods, please see Sarikaya et al. (2003) "Molecular biomimetics: nanotechnology through biology" *Nature Materials*. 2(9), 577-585. A typical protocol consists of incubating the peptide library (attached to a biological vector) with the metal oxide surface, then washing the surface thoroughly to remove sequences that bind weakly. Those that bind strongly are then eluted from the surface with a low pH buffer and the population amplified by allowing the vector to multiply. These screened binding sequences can be determined by direct sequencing. The process is repeated with increasingly stringent wash conditions until only one or several binding peptide sequences remain, which will bind the surface with high affinity.

A specific example for such a method is the use of an M13 bacteriophage library (phage display) to generate ZnO nanowire-binding sequences. This protocol has been adapted from Whaley et al. (2000) "Selection of peptides with semiconductor binding specificity for directed nanocrystal assembly" *Nature*. 405, 665-668. The library contains approximately 1 billion ($10^9$) random peptide sequences expressed on the viral coat which are screened for their ability to bind ZnO nanowires. After washing, the bound phage are eluted (pH 2.2) and amplified by allowing them to infect their bacterial host (E. Coli ER2537). After 5-6 successively more stringent rounds of selection an optimal ZnO-binding sequence is determined.

Examples of a ZnO-binding sequence includes, but not limited to, RSNTRMTARQHRSANHKSTQRARS (SEQ ID NO. 43) or a binding fragment thereof, GLHIPTSHR (SEQ ID NO. 44), EAHVMHKVAPRP (SEQ ID NO. 45), and RIGHGRQIRKPL (SEQ ID NO. 46). The coupling can be accomplished synthetically or recombinantly (Thai C K, et al., *Biotechnol. Bioeng*, 2004, 87, 129-137, which is hereby incorporated by reference by its entirety). The ZnO-binding peptide sequence direct method offers the advantage of controlling directionality of the PSI protein so that electron ejection is directed to the electrode surface, limiting the distance between the PSI protein and semiconductor and simplifies the procedure by eliminating semiconductor pretreatment.

One specific method to couple the ZnO-binding motif to the photosystem (in this case PS-I) is to genetically engineer a fusion protein between the binding peptide and one of the PS-I subunits, in this case PsaD. The PsaD fusion protein was designed to have the ZnO-binding sequence added to the N-terminus and a 6xHistadine tag fused to the C-terminus. The resulting protein sequence was then used to design an oligonucleotide set using DNAWorks 3.1 to be used in PCR-based gene assembly. This method facilitated the construction of full-length synthetic genes that were optimized for expression in bacteria (*E. Coli*). Detailed methods are described in Stemmer et al. (1995) "Single-step assembly of a gene and entire plasmid from large numbers of oligodeoxyribonucleotides." *Gene*. 164(1), 49-53. The genes were then cloned into a plasmid expression construct, introduced in *E. Coli* for large-scale expression, and the ZnO-binding PsaD fusion protein extracted and purified using the 6xHistidine tag. A large excess of recombinant PsaD was then mixed with native PS-I and through subunit exchange we generate PS-I with ZnO binding capacity.

As used herein the term "nanowire" means a wire (or other filamentous structure) with a diameter scale on the order of nanometers (nm). Growth of nanowires having various aspect ratios, including nanowires with controlled diameters, is described in, e.g., Gudiksen et al. (2000) "Diameter-selective synthesis of semiconductor nanowires" *J. Am. Chem. Soc.* 122, 8801-8802; Cui et al. (2001) "Diameter-controlled synthesis of single-crystal silicon nanowires" Appl. Phys. Lett. 78, 2214-2216; Gudiksen et al. (2001) "Synthetic control of the diameter and length of single crystal semiconductor nanowires" *J. Phys. Chem. B* 105, 4062-4064; Morales et al. (1998) "A laser ablation method for the synthesis of crystalline semiconductor nanowires" *Science* 279, 208-211; Duan et al. (2000) "General synthesis of compound semiconductor nanowires" *Adv. Mater.* 12, 298-302; Cui et al. (2000) "Doping and electrical transport in silicon nanowires" *J. Phys. Chem. B* 104, 5213-5216; Peng et al. (2000) "Shape control of CdSe nanocrystals" Nature 404, 59-61; Puntes et al. (2001) "Colloidal nanocrystal shape and size control: The case of cobalt" *Science* 291, 2115-2117; U.S. Pat. No. 6,306,736 to Alivisatos et al. (Oct. 23, 2001) entitled "Process for forming shaped group Ill-V semiconductor nanocrystals, and product formed using process"; U.S. Pat. No. 6,225,198 to Alivisatos et al. (May 1, 2001) entitled "Process for forming shaped group II-VI semiconductor nanocrystals, and product formed using process"; U.S. Pat. No. 6,036,774 to Lieber et al. (Mar. 14, 2000) entitled "Method of producing metal oxide nanorods"; U.S. Pat. No. 5,897,945 to Lieber et al. (Apr. 27, 1999) entitled "Metal oxide nanorods"; U.S. Pat. No. 5,997,832 to Lieber et al. (Dec. 7, 1999) "Preparation of carbide nanorods"; Urbau et al. (2002) "Synthesis of single-crystalline perovskite nanowires composed of barium titanate and strontium titanate" *J. Am. Chem. Soc.*, 124, 1186; and Yun et al. (2002) "Ferroelectric Properties of Individual Barium Titanate Nanowires Investigated by Scanned Probe Microscopy" *Nanoletters* 2, 447. The nanowires of this invention can be substantially homogeneous in material properties, or in certain embodiments can be heterogeneous (e.g., nanowire heterostructures). The nanowires can be fabricated from essentially any convenient material or materials, and can be, e.g., substantially crystalline, substantially monocrystalline, polycrystalline, or amorphous. It should be appreciated that although nanowires are frequently referred to, nanostructures, such as nanorods, nanotubes, nanotetrapods, nanoribbons and/or combinations thereof can also be employed.

The metal oxide nanowires (B, referring to FIG. 2) used accordance with this invention include, but are not limited to, titanium oxide, zinc oxide, tin oxide, alumina, zirconia, ceria, silica, yttria, boronia, magnesia, strontium titanate, potassium titanate, barium titanate, calcium titanate, calcia, ferrite, hafnia, tungsten trioxide, iron oxide, copper oxide, nickel oxide, cobalt oxide, barium oxide, strontium oxide, vanadium oxide, indium oxide, barium titanate, aluminosilicate, niobium oxide and calcium phosphate. These compounds can be selected depending on the intended use, and may be used singly or in combination. Among these metal oxide nanowires, titanium oxide, zinc oxide, tin oxide, indium oxide and tungsten oxide are most preferable due to the wide energy gaps of 3 eV or wider.

For example, to form GaAs semiconductor nanocrystals, a solution of Ga and As precursors may be prepared by dissolving an organic complex of Ga and As powder into tributyl phosphine. About 2 ml. of this solution (kept at $-10°$ C.) may then be quickly injected into about 4 grams of a heated bath comprising a binary mixture of (99% pure) tri-octyl phosphine oxide (TOPO) and 17 molar % hexyl phosphonic acid (HPA) which had been preheated to a temperature of about 360° C. After the injection, the temperature of the binary mixture bath drops to approximately 300° C. and is kept at this temperature for about 5-10 minutes for the fast growth of rod-like GaAs semiconductor nanocrystals. After this time period, the binary mixture bath is rapidly cooled. The same procedure may be used to form spherical semiconductor nanocrystals by reducing the concentration of the H:PA down to, for example, about 4 molar % and increasing the reaction time at 300° C. up to several hours. Similar results may be obtained substituting other particular Group III metals (Al or In) for Ga and/or substituting other particular Group v precursors (P or Sb) for As.

To form CdSe semiconductor nanocrystals, a solution of Cd and Se precursors is prepared by dissolving 0.82 grams of $Cd(CH_3)_2$ and 0.4 grams of Se powder into 15.3 grams of tributyl phosphine. 2 ml of this solution (kept at $-10$ C) was then quickly injected into 4 grams of a heated bath comprising a binary mixture of (99% pure) tri-octyl phosphine oxide (TOPO) and 17 molar % hexyl phosphonic acid (HPA) which had been preheated to a temperature of about 360° C. After the injection, the temperature of the binary mixture bath drops to approximately 300° C. and is kept at this temperature for about 5-10 minutes for the fast growth of rod-like semiconductor nanocrystals. After this time period, the binary mixture bath is rapidly cooled. The same procedure may be used to form spherical semiconductor nanocrystals by reducing the concentration of the HPA down to, for example, about 4 molar % and increasing the reaction time at 300° C. up to several hours.

The reaction was repeated several times with the concentration of the HPA surfactant in the binary mixture bath respectively at 1.5 weight % (3.42 molar %), 3.0 weight % (6.61 molar %), 5.0 weight % (10.91 molar %), 8.0 weight % (16.83 molar %), 10.0 weight % (20.54 molar %), and 20.0 weight % (36.78 molar %), with the reaction time extended to several hours for the reactions using 1.5 and 3.0 weight % HPA. The semiconductor nanocrystals recovered from each batch were examined under transmission electron microscopy (TEM) and powder x-ray diffraction (XRD). The semiconductor nanocrystals grown in the baths respectively containing 1.5 and 3.0 weight % of the HPA growth control agent were generally spherical in shape, while the semiconductor nanocrystals grown in the baths containing 5.0, 8.0. 10.0, and 20.0 weight % HPA had rod-shaped morphologies. Both measurements showed that the long axis of the rods along the c-axis was consistent with a wurtzite structure. Perpendicular to the c-axis, the semiconductor nanocrystal rods appear as faceted hexagons. Similar results may be obtained substituting other particular Group II metals (Zn or Hg) for Cd and/or substituting other particular Group VI precursors (S or Te) for Se.

To form ZnO nanowires, ZnO powder and graphite powder can be mixed in a weight ratio 1:3 to 3:1 and loaded into a graphite boat, placed into a quartz tube being flushed with Ar gas with a flow rate between 100 and 2000 sccm. The gas can contain between 1 and 10 ppm oxygen. A (100) $SrTiO_3$ single crystal substrate coated with a film of gold with a thickness between 1 and 100 nm can be placed in the tube downstream of the graphite boat where the temperature gradient between the graphite boat and the substrate can be approximately 300° C. The quartz tube can be heated to between 900° C. and 1000° C. for 0.25 to 1 hour to grow the nanowires. Alternatively, zinc metal can be used as the metal vapor source, in which case the tube furnace was heated to between 500° C. and 700° C. The nanowires can be grown on the single crystal surface in a uniform diameter and length, ranging from 10 to 50 nm and 1 to 2 μm, respectively.

In a preferred embodiment, the nanowires can be grown from a ZnO foil. One such protocol that has been used in obtaining functional bio-photovoltaic devices was as follows: A 0.075 M $ZnSO_4$ aqueous solution (40 ml) containing $NH_4Cl$ (molar ratio of $NH^{+4}/Zn^{+2}$=20:1) was formed. The pH was adjusted to ~11.7 with NaOH pellets. Pieces of 0.25 $cm^2$ Zn foil were suspended in the solution and the vial containing the solution was transferred to a water bath at 60° C. and left overnight for 12-15 h at 60° C. The effects of varying pH were studied showing that at pH 13, the nanowires produced were black in color indicating a lower bandgap. This process requires very little heat and only a small number of steps and does not require the use of harmful chemicals. The varying of the pH levels provides an improvement over the protocol of F. Xu et al. (*Nanotechnology* 17 (2006) 588-594), which is hereby incorporated by reference by its entirety.

The electrodes used in accordance of this invention include, but not limited to platinum, gold, silver, graphite and aluminum. Electrodes are deposited using well-known process, including a vacuum evaporation method, a sputtering method or CVD (Chemical Vapor Deposition) method. The nanowires are preferably attached to or otherwise in contact with a cathode C (referring to FIG. 2), such as gold. The anode is preferably silver. The cathode and anode are preferably separated by a semiconductor material. The density of the nanowires on the substrate can vary widely. In one implementation, when using the flexible Zn foil to grow nanowires, the photoanode electrode is the Zn foil itself while the photocathode is either deposited on the gel or solid electrolyte or is a transparent-conductor covered glass plate attached to the device. Preferably, in all cases appropriate number of nanowires per $cm^2$ can be arranged such as to increase the available surface area by two to three orders of magnitude.

A semiconductor material can be positioned between the cathode and anode and can be organic, inorganic or polymer based. A wide range of semiconductor material can be used in accordance to this invention, such as, but not limited to Si, Ge, Sn, Se, Te, B, C (including diamond), P, B—C, B—P($BP_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $SiN_4$, $Ge_3N_4$, $Al_2O_3$, $(Al, Ga, In)_2(S, Se, Te)_3$, ITO, $Al_2CO$, $C_{60}$, $Alq_3$, and an appropriate combination thereof. In a preferred embodiment, the semiconductor material used in this invention is selected from $Alq_3$, $Al_2O_3$, and $C_{60}$. The thickness of the semiconductor layer can vary. However, suitable thicknesses can be between 5 microns and 700 microns.

The support can be any surface or substrate suitable for deposition of the semiconductor layer. In one embodiment, the support is a transparent material and includes, but is not limited to, glass and plastic. The support has the electrode deposited thereon.

The stabilized photosystem can be deposited onto the nanowires by a number of methods. In one embodiment, a solution (e.g., an aqueous solution) comprising the surfactant peptides, photosystem (or components thereof) are mixed in a concentration and temperature that allow the surfactants and photosystem to self-assemble into a stabilized nanostructure. A buffer can optionally be added to control the pH and, thereby, the charge of the surfactant. The surfactant can be preferably added to the solution in an amount of between 0.01 and 10.0 percent by weight. Likewise, the photosystem can preferably be added to the solution in an amount between 0.1 and 1 mg/mL. The relative concentration of the surfactant and photosystem are between 1000:1 and 1:1, such as 200:1 and 50:1. Room temperature will usually be sufficient to prepare the stabilized photosystems. However, other temperatures that do not degrade, denature or inactivate the photosystem can also be used. Examples include between 0° C. and 85° C. The solution so formed can be contacted or mixed with the support having deposited thereon the electrodes, semiconductor and nanowires. The stabilized photosystem is then allowed to interact with the nanowires and complex, bind or associate therewith. Because the photosystem is stabilized, the solution can then be removed and the device dried.

The resulting photovoltaic cell has a high density of photosystem to support surface area. Preferably, the density achieved is at least about 50% coverage of the available surface area.

The resulting photovoltaic cell is preferably encapsulated in a protective and transparent coating or covered by a transparent layer. A preferred protective layer is glass.

The invention also includes solar cells that incorporate the photovoltaic devices described herein.

EXAMPLES

The present invention will be better understood in connection with the following examples, which are intended as an illustration only and not limiting of the scope of the invention. Various changes and modifications to the disclosed embodiments will be apparent to those skilled in the art and such changes and modifications including, without limitation, those relating to the chemical structures, substituents, derivatives, formulations and/or methods of the invention may be made without departing from the spirit of the invention and the scope of the appended claims.

Figure 2:
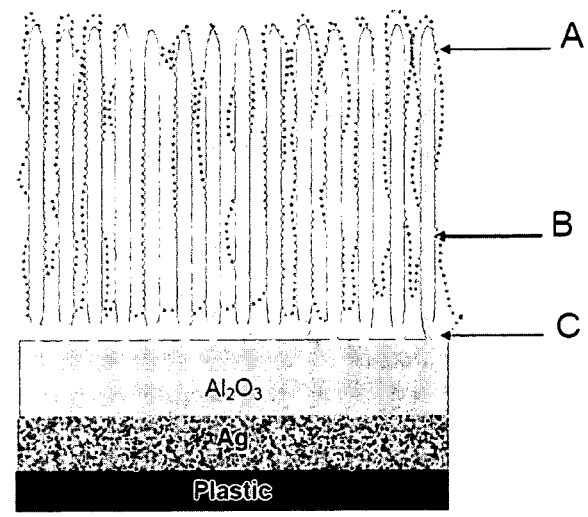
FIGS. 2(a) and (b) illustrate the architectures of a photo-toelectronic conversion device comprising self-assembled PS-I layer on zinc oxide nanowires.
Figure 2:
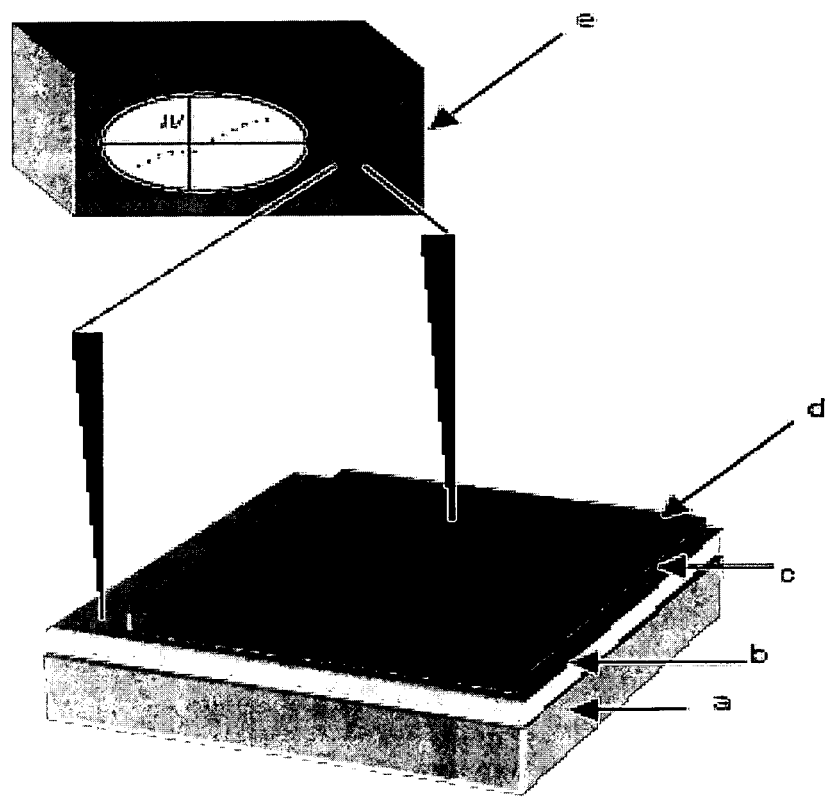

FIG. 2 illustrates a representative device architecture which can be used with the present invention. As depicted in FIG. 2a, the self-assembled photosynthetic monolayer (A) coated on zinc oxide nanowires (B) is attached to sputtered gold seeds (C) which is attached to a semiconductor material $Al_2O_3$, and further attached to an apposing Ag electrode and then covered with a transparent plastic. FIG. 2b illustrates a 3-dimensional photovoltaic device used for the Dark/Light I-V and I-t measurements. The self-assembled photosynthetic PS-I monolayer (d) coated on zinc oxide nanowires (c) is attached to ITO layer (b) coated on glass (a). The measuring instrument (e) is used for dark/light IV and I-t measurements.

Figure 3A:
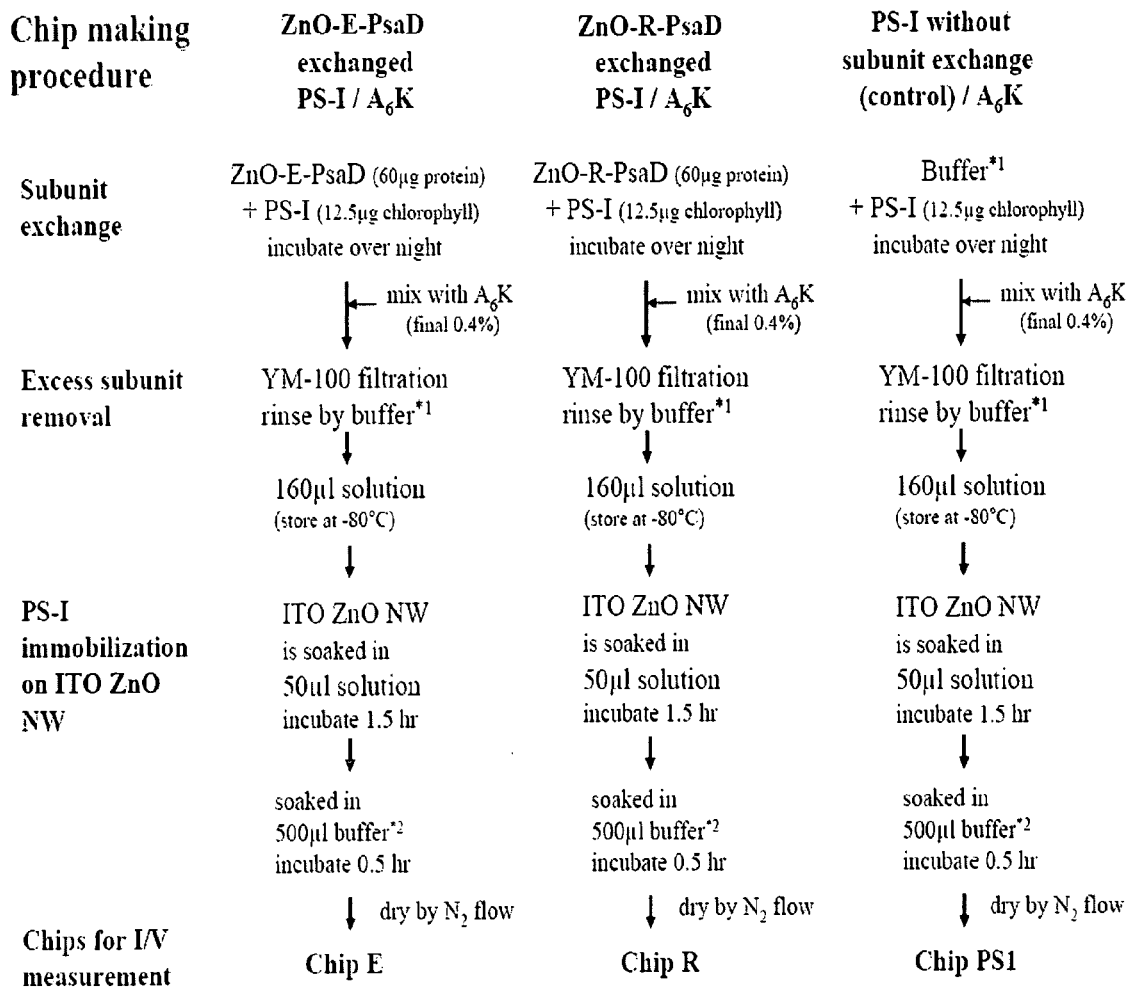
FIGS. 3(a) and (b) shows a flowchart for making of the Chips and the compositions of the subunit designs.

FIG. 3a provides the "chip making" procedures for two different amino peptide binding His6-PsaD subunit designs and one with only native PSI (without the subunit). Native PSI complexes are isolated from spinach leaves as described in *J. Biol. Chem.*, 1988, 263, 7302-7308. A single His tag is introduced to isolated psaD (a protein subunit of PSI). First, the gene PsaD from Prochlorococcusmarinus is cloned into pET-21b between NdeI and XhoI, adding a C-terminal His6 tag (pET-21 B is obtained from Novgen, Madison, Wis.). This recombinant psaD-Hisprotein is expressed in *E. Coli* (BL21 [DE3]) and is purified by immobilized metal affinity chromatography. Next, the genetically modified protein (psaD-His6) is attached on the ZnO tag with a ZnO binding peptide sequence EAHVMHKVAPRP (SEQ ID NO. 45) to give subunit design ZnO-E-PsaD for use in the preparation of "Chip E" and RIGHGRQIRLPL (SEQ ID NO. 46) to give subunit design ZnO-R-PsaD for use in the preparation of "Chip R" (FIG. 3b). M13 bacteriophage library (phage display) is to generate ZnO nanowire-binding sequences. This protocol has been adapted from Whaley et al. (2000) "Selection of peptides with semiconductor binding specificity for directed nanocrystal assembly" *Nature*. 405, 665-668. The library contains approximately 1 billion ($10^9$) random peptide sequences expressed on the viral coat which are screened for their ability to bind ZnO nanowires. After washing, the bound phage are eluted (pH 2.2) and is amplified by allowing them to infect their bacterial host (*E. Coli* ER2537). After 5-6 successively more stringent rounds of selection an optimal ZnO-binding sequence is determined. The appropriate subunit design (60 µg) is then incubated overnight with 12.5 µg of native PSI and 0.4% of surfactant peptide $A_6K$ (AAAAAAK (SEQ ID NO: 47)). This incubation permits the ZnO-E-PsaD or ZnO-R-PsaD subunit to be exchanged from the native PSI complexes and replaced by the psaD-His6. The excess PsaD subunit is removed by filtration with YM-100 filtration system and is product is rinsed with a buffer (10 mM MOPS (pH7.0), 2 mM NaCl, 0.05% dodecyl beta-D-maltoside). The product is stored at −80° C. as a solution (160 µl). Next, the PS-I immobilization on ITO ZnO NW is achieved by soaking the ZnO nanowires (NW) on a transparent and conductive indium-tin oxide (ITO)-coated glass by following a seeding and growing procedure. While there are many ways of doing so, one instance can be described as follows: the cleaned ITO glasses are exposed to 0.01M $Zn(Ac)_2$/EtOH, and then blown dry with Nitrogen gas (repeated several times with no rinsing). The coated substrates into an oven at 350° C. for 20 min and the whole process is repeated several times. The now seeded ITO glass is exposed to 0.01M $Zn(NO_3)_2 + C_6H_{12}N_4$ at 75° C. overnight. Finally, after equilibrating at room temperature a 50 µl solution of the PS-I complex is dropped on the treated ITO surface (which now contains ZnO NW) and is incubated for 1.5 hours. The ITO ZnO NW is then soaked in a 500 µl of 8 mM MOPS (pH7.0), 1.6 mM NaCl, 0.04% dodecyl beta-D-Maltoside, 0.2% A6K buffer and is further incubated for 0.5 hour. The solid device is then dried under a flow of nitrogen to produce the desired "Chip E" and "Chip R".

The preparation of "Chip PSI", without any subunit design, is very similar to the procedure of preparing Chips E and R, with the exception that there is no subunit exchange step involved. Instead of the exchange unit step, 12.5 µg of chlorophyll (PS-I) in 10 mM MOPS (pH7.0), 2 mM NaCl, 0.05% dodecyl beta-D-maltoside is incubated overnight.

Figure 4A:
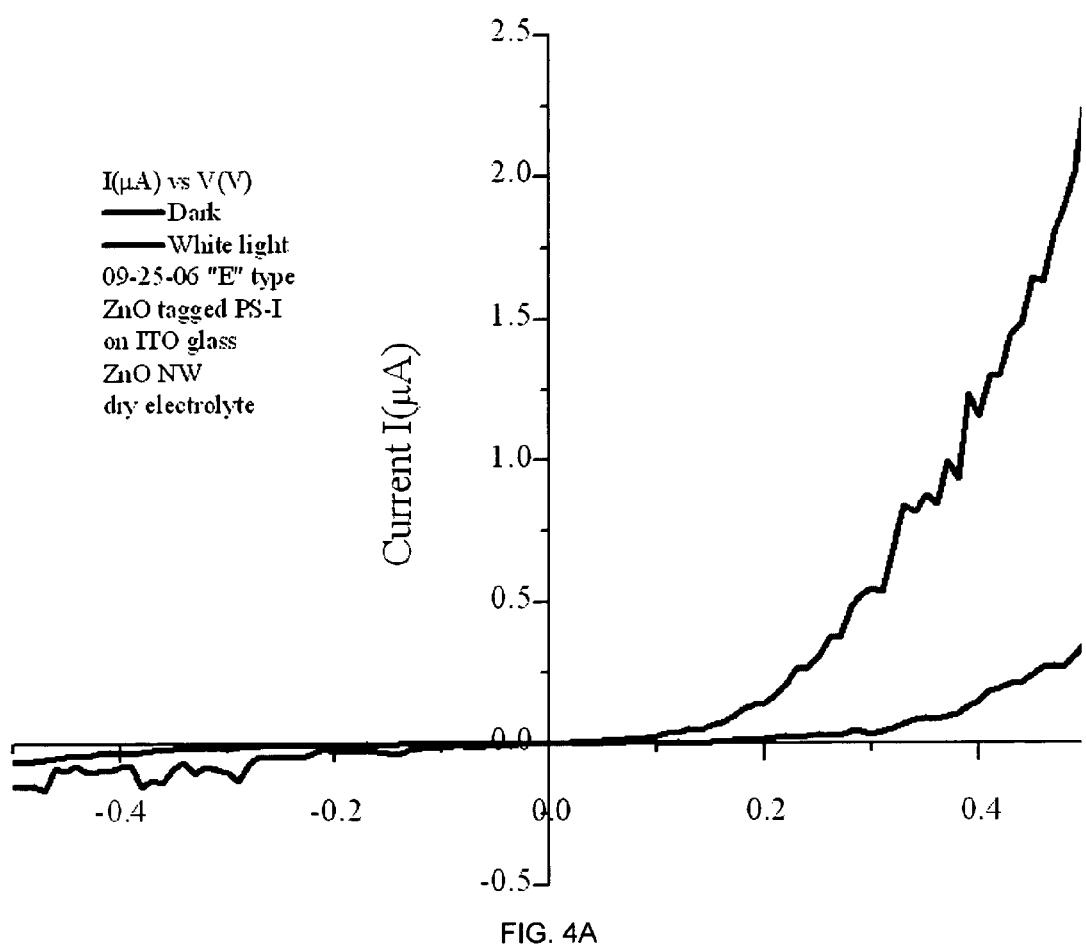
FIGS. 4(a) and (b) illustrate IV graphs for the oriented and unoriented PS-I in dry electrolyte.
Figure 4B:
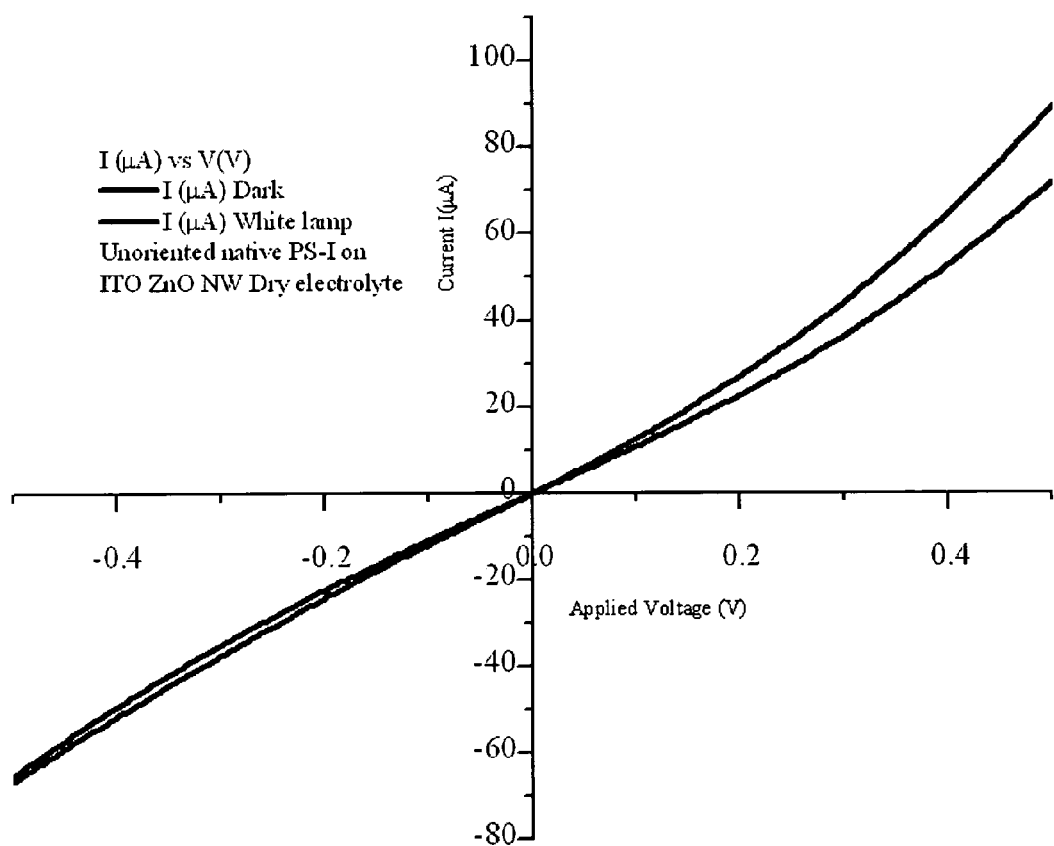
Figure 5A:
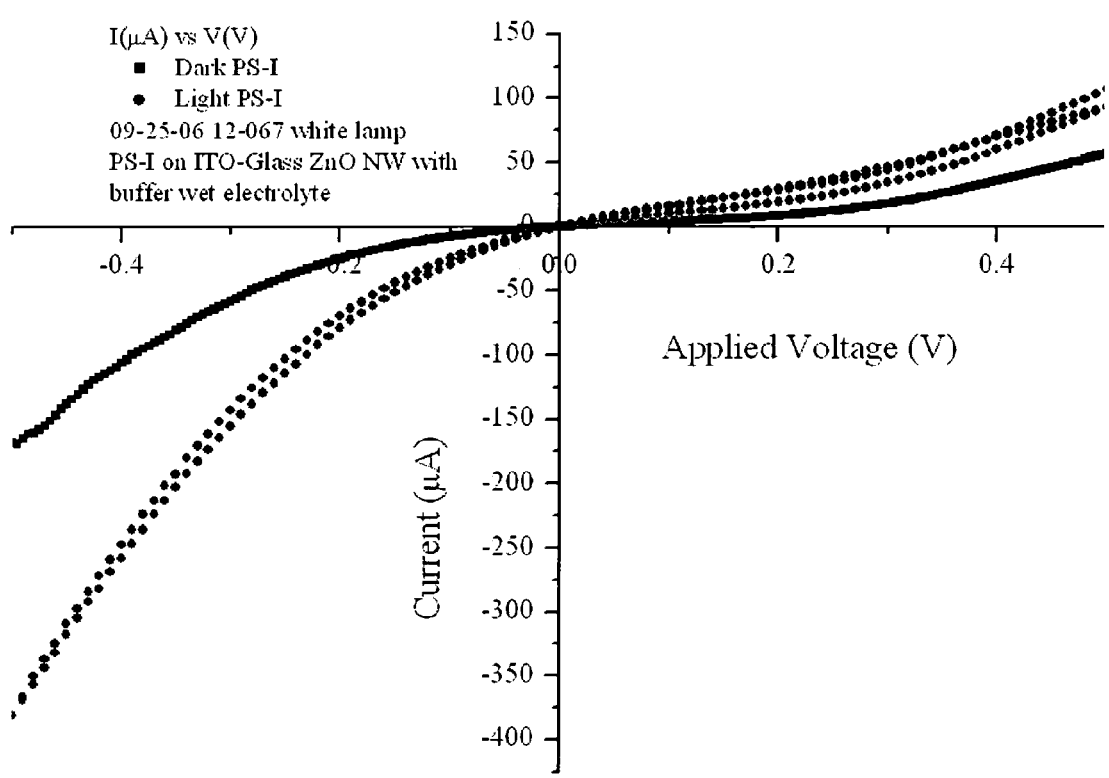
FIGS. 5(a) and (b) show IV graphs for wet and dry electrolyte with unoriented native PS-I.
Figure 5B:
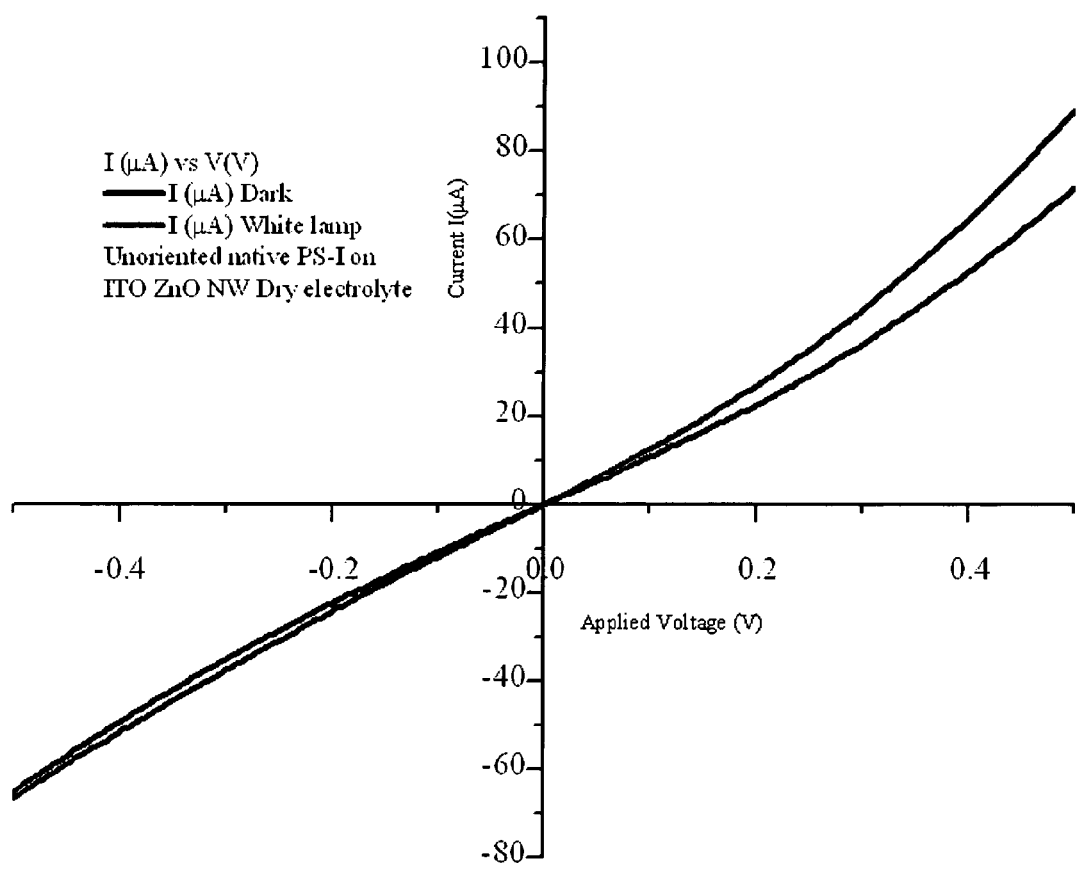
Figure 6:
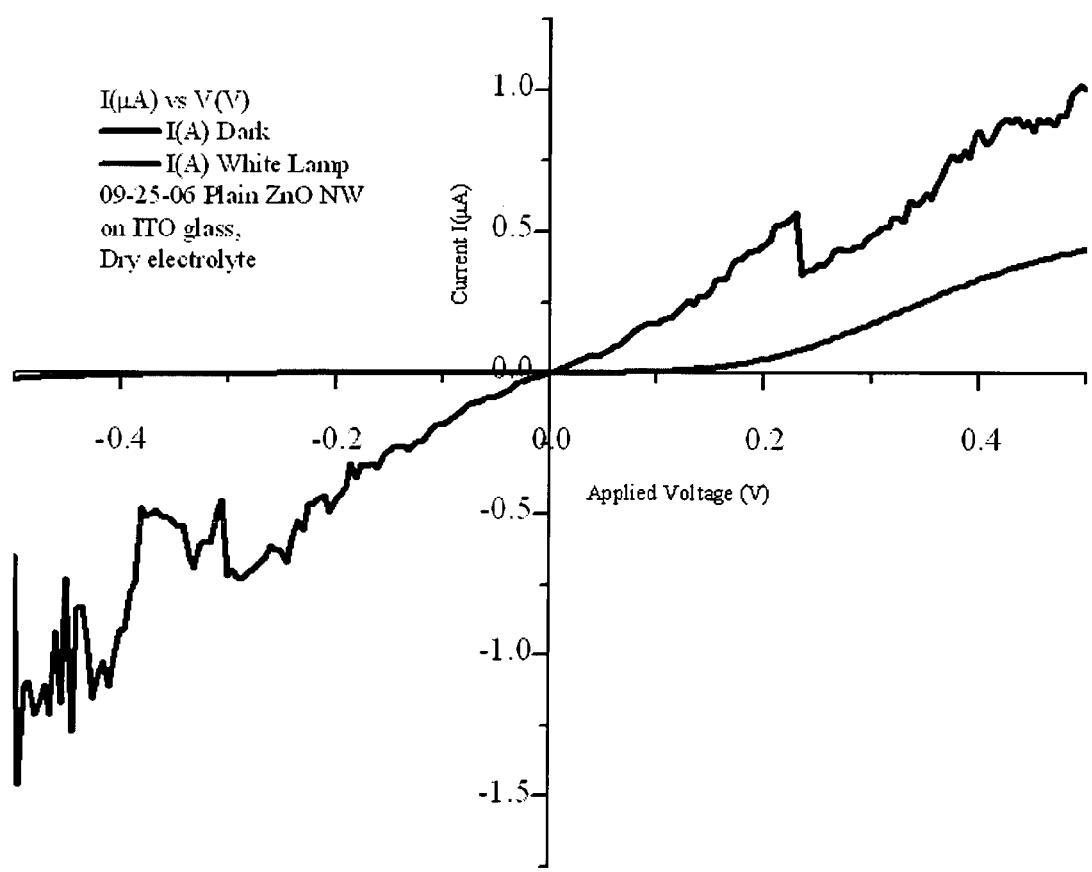
FIG. 6 illustrates an IV graph for the control.
Figure 7:
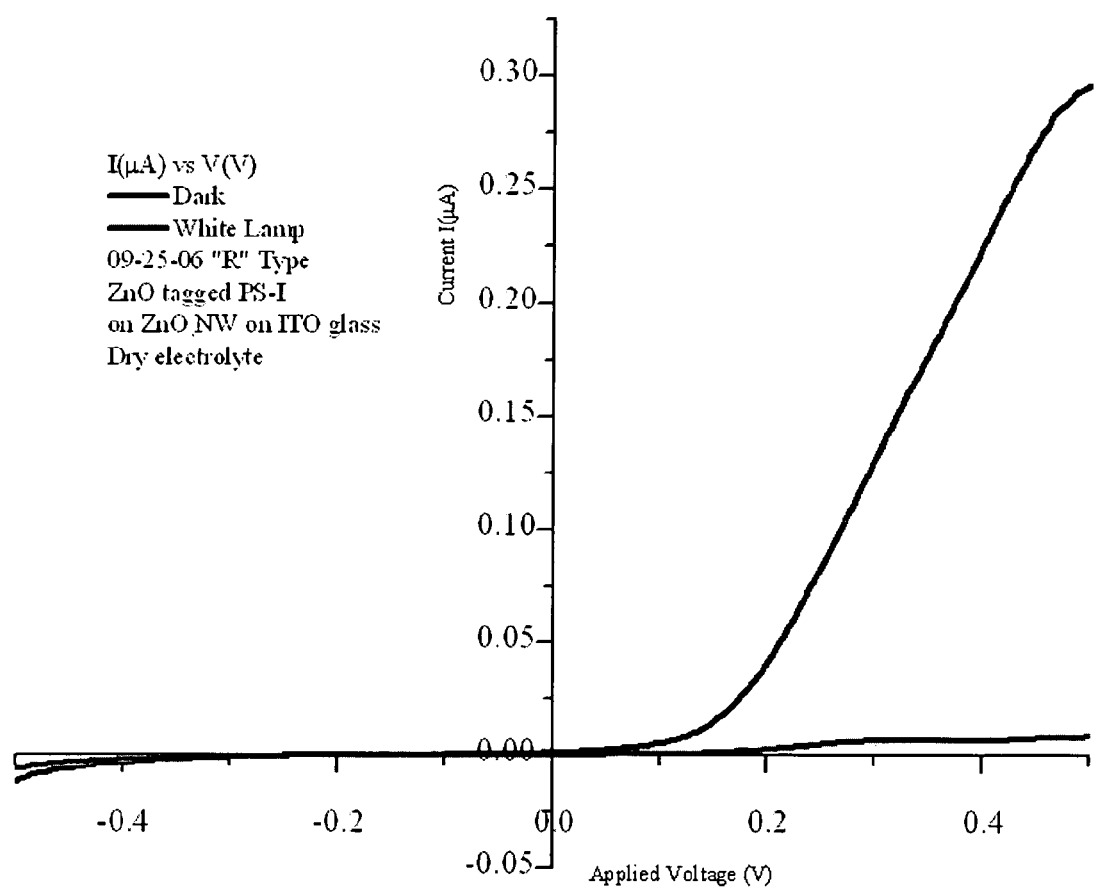
FIG. 7 shows an IV graph for "R" tagged PSI in dried electrolyte.
Figure 8:
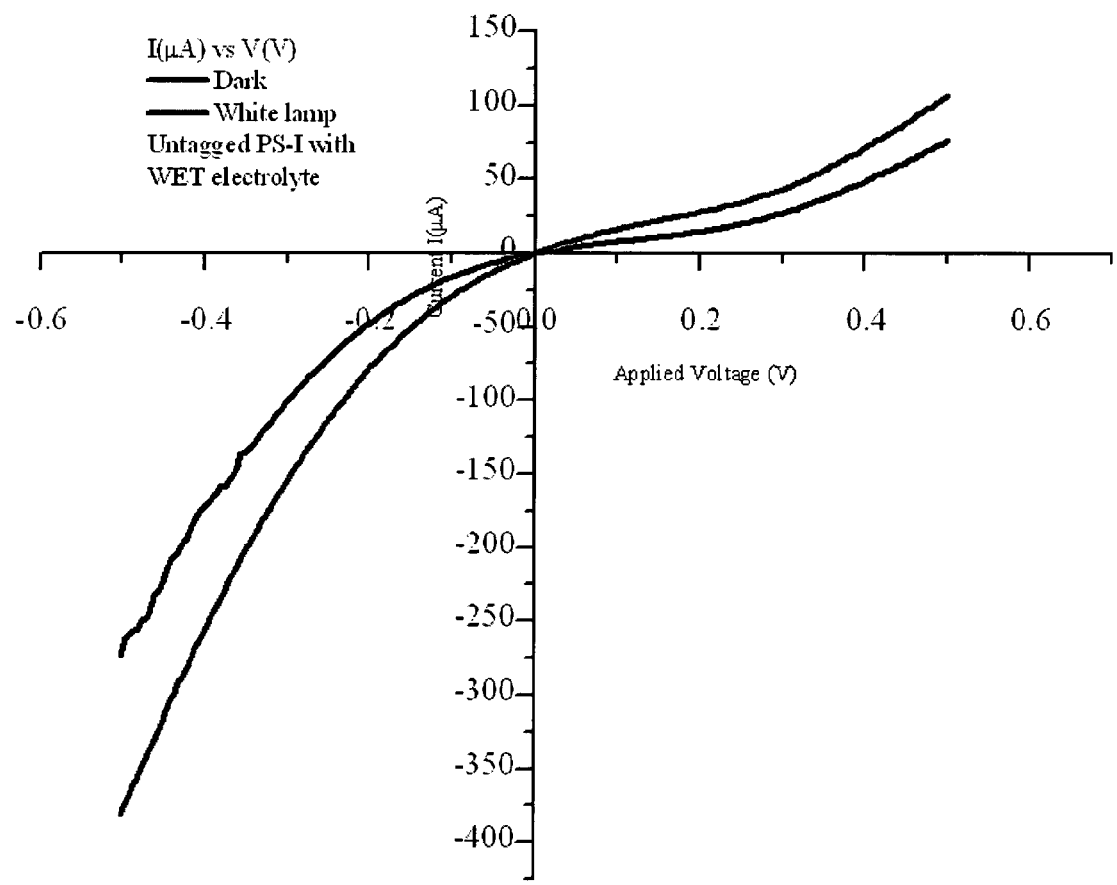
FIG. 8 shows an IV graph for an untagged native PSI with wet electrolyte.
Figure 9:
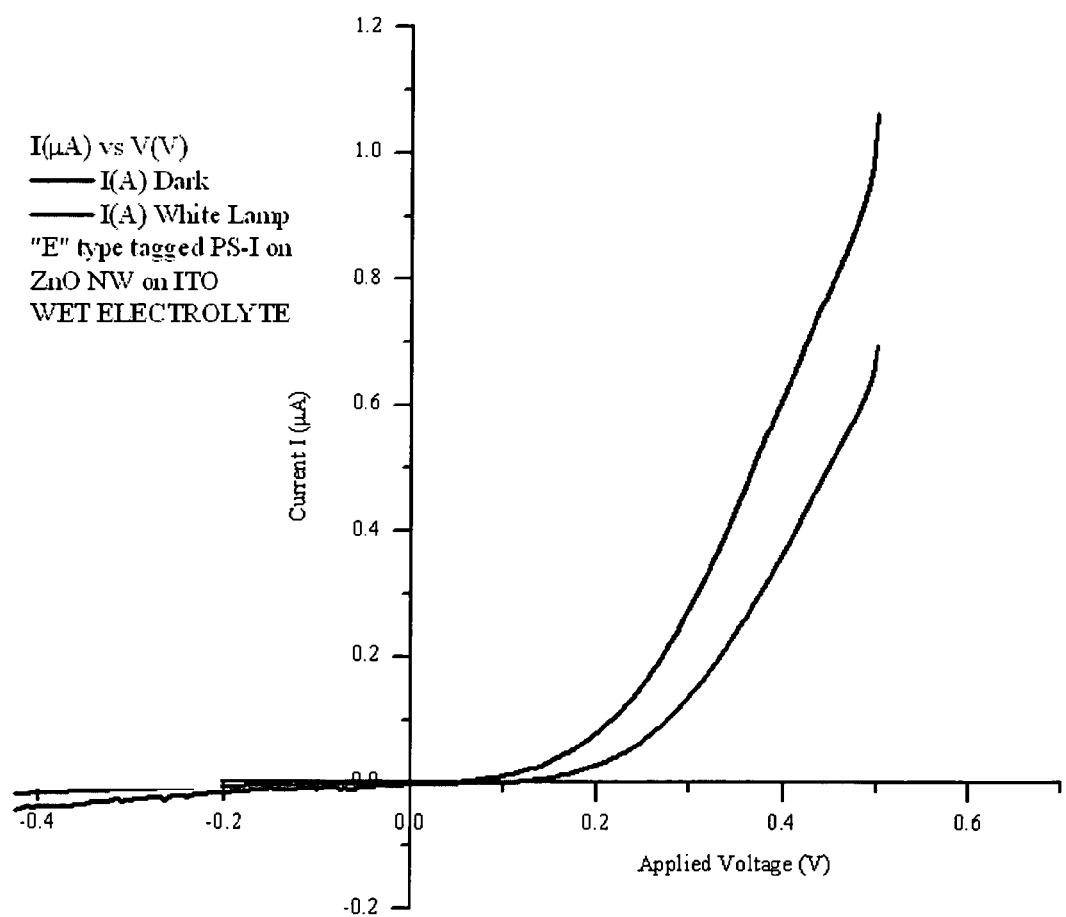
FIG. 9 is an IV graph for "E" tagged PSI with wet electrolyte.
Figure 10:
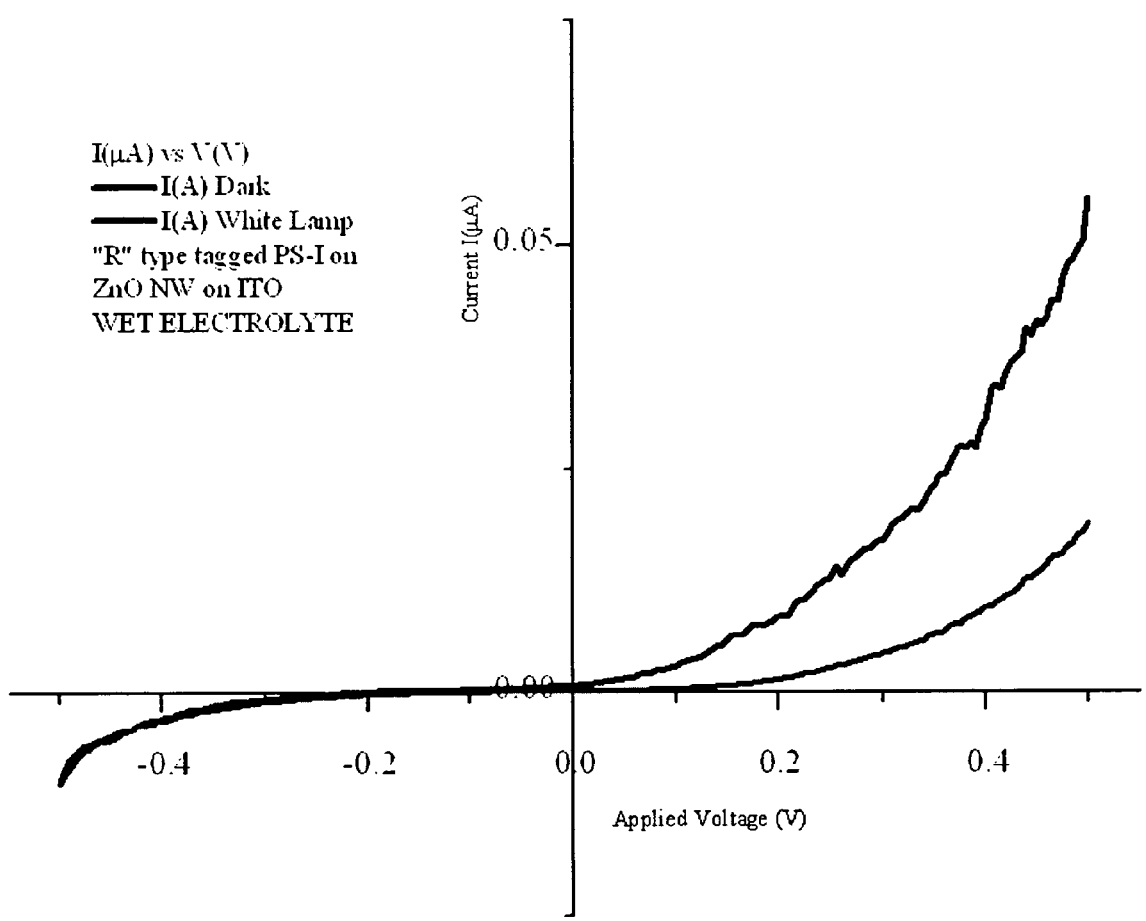
FIG. 10 shows IV graphs for "R" tagged PSI with wet electrolyte.
Figure 11A:
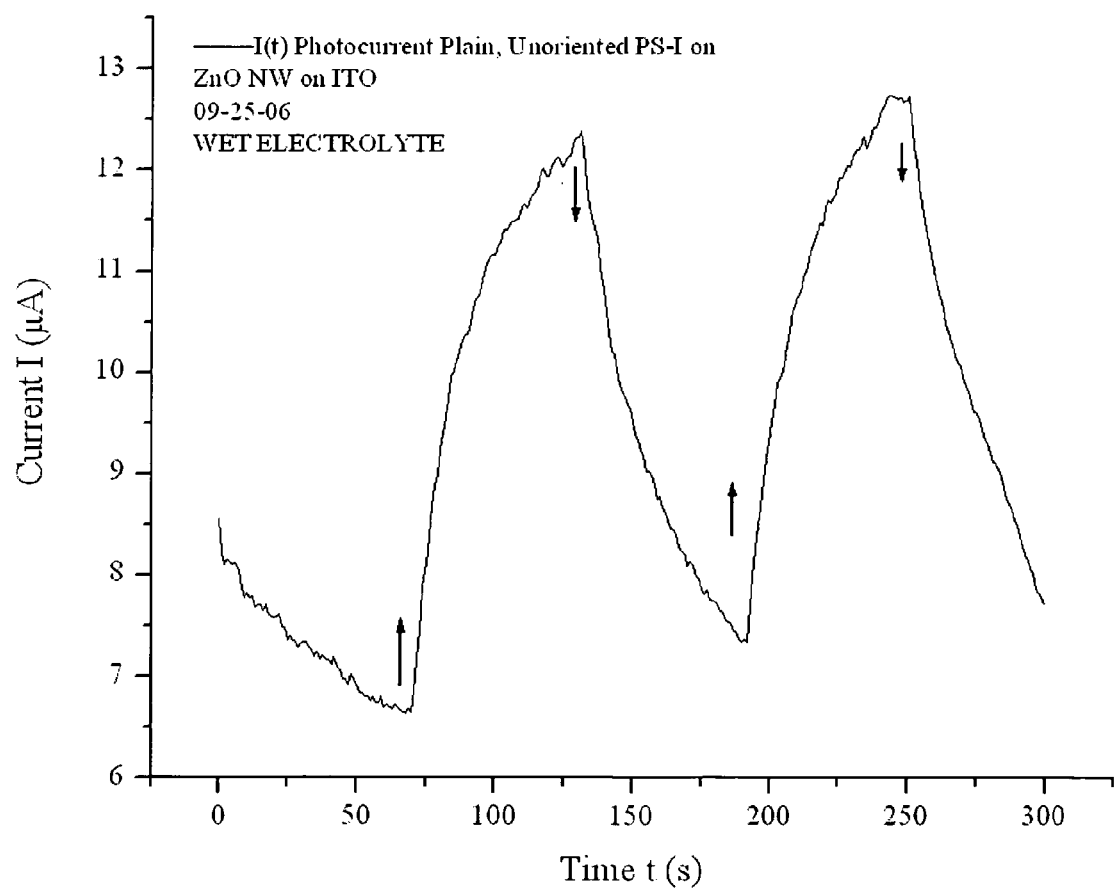
FIGS. 11(a) and (b) describe I-t graphs with untagged PS-I with wet and dry electrolyte.
Figure 11B:
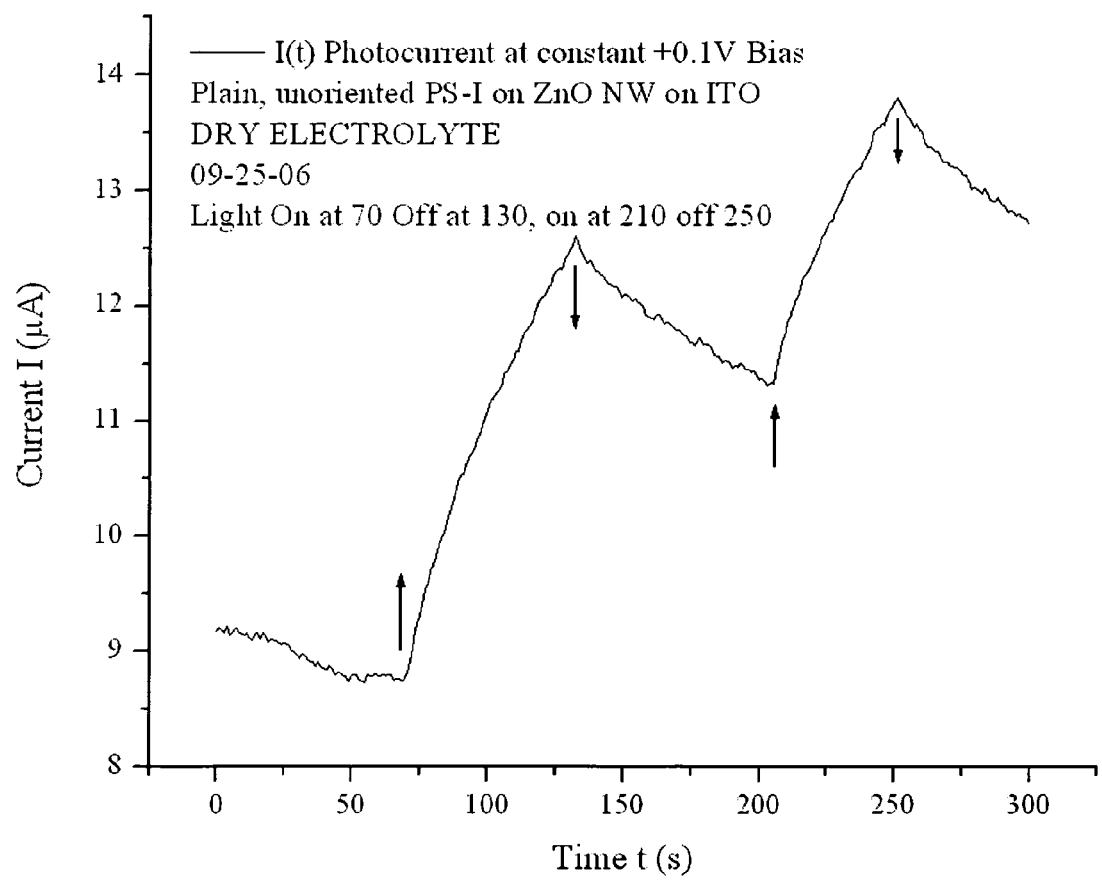

Chips "E", "R" and "PS1" are then subjected to Dark/Light I-V and I-t measurements and are compared to ZnO NW on ITO control. Two conditions were used for the Dark/Light I-V and I-t measurements. One condition involves wet buffer that connects the top probe to tips of ZnO NW. The other condition includes a dried buffer wherein the top probe is pushed to touch the wires. FIG. 4 describes IV graphs showing clear difference between the oriented and unoriented PS-I in dry environment. The dry "E" tag (oriented PS-I) exhibits diode behavior with low current (FIG. 4a). The untagged (unoriented) PS-I exhibits Ohmic behavior with high current (FIG. 4b). FIG. 5 describes the effect of drying electrolyte/buffer with unoriented native PS-I. FIG. 5a is for wet electrolyte buffer and FIG. 5b is for dry electrolyte buffer. The effect is comparable with positive current, but much reduced with negative current (cf diode). FIG. 6 shows an IV graph for the control in dried electrolyte (plain dry ZnO NW on ITO glass). The light exposure appears to activate diode response (i.e. Dark: Ohmic, Light: Diode). FIG. 7 is a graph of "R" tagged PSI in dried electrolyte that gives diode but the behavior is backwards. In dark light, high current is observed and in white lamp, low current is produced. FIG. 8 is an IV graph of untagged native PSI with wet electrolyte. Semi Ohmic behavior is observed in this situation. FIG. 9 is an IV graph that shows the "E" tagged PSI with wet electrolyte gives backwards diode. High current are observed with both dark and white lamp. FIG. 10 is an IV graph that shows the "R" tagged PSI with wet electrolyte also gives backwards diode. FIG. 11 shows I-t measurements for untagged PS-I with wet (FIG. 11a) and dry electrolyte (FIG. 11b). More positive photocurrent is observed as a result of illumination. The reaction time was found to be slower with the dry electrolyte, however the amplitude was the same between the two.

Figure 12:
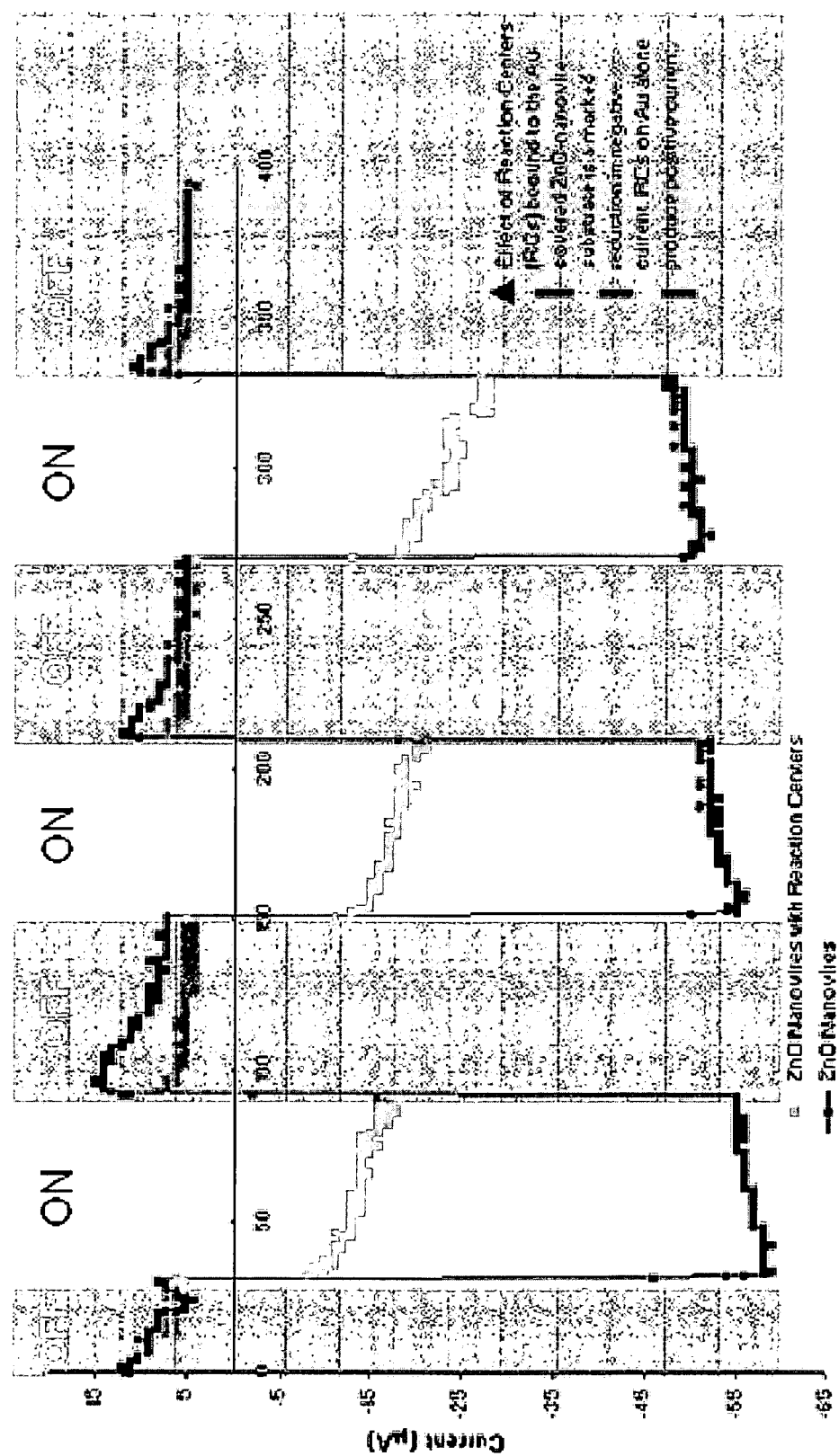
FIG. 12 illustrates the effect of Cyanobaterial Reaction Center (RC) self-assembly on ZnO nanowire substrate.

FIG. 12 shows the effect of cyanobacterial reaction center self-assembly on ZnO nanowires substrate for a wet biosensitized solar cell (BSSC) with cyanobacterial reaction center (RCs) immobilized backward. Since the RCs are immobilized "backwards", therefore the effect is in opposite direction. The power efficiency Pin/Pout is approximately 0.5%.

Figure 13:
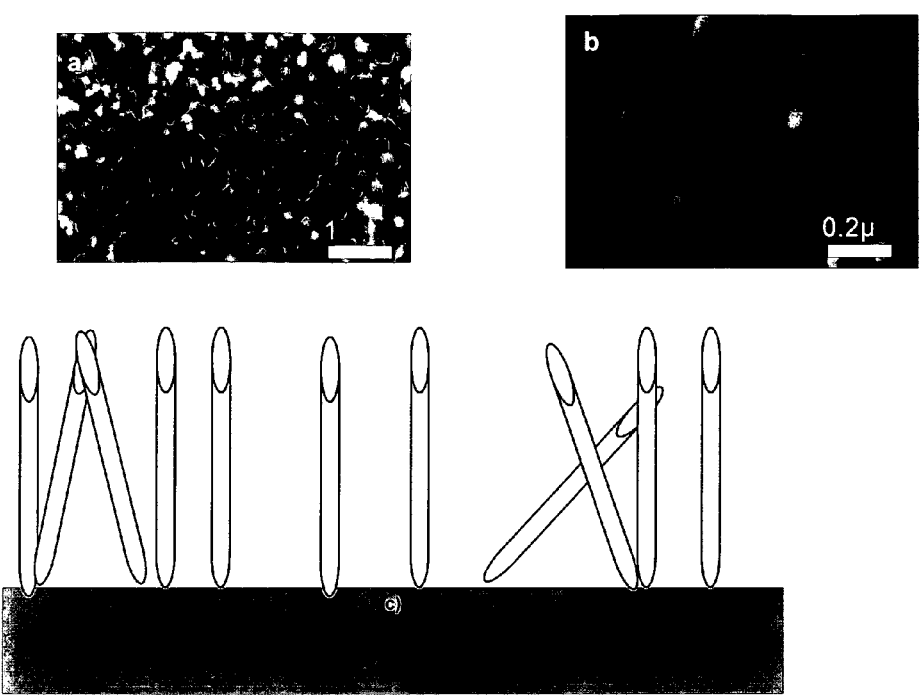
FIG. 13(a)-(c) show SEM micrographs and drawing of ZnO nanowires grown from zinc foil.

FIGS. 13(a) and 13(b) are SEM micrographs of zinc oxide nanowires which were grown from zinc foil. The relatively disordered ZnO nanowires can be seen from the micrographs and further depicted in FIG. 13(c).

The patent and scientific literature referred to herein establishes the knowledge that is available to those with skill in the art. All United States patents and published or unpublished United States patent applications cited herein are incorporated by reference. All published foreign patents and patent applications cited herein are hereby incorporated by reference. All other published references, documents, manuscripts and scientific literature cited herein are hereby incorporated by reference.

While this invention has been particularly shown and described with references to preferred embodiments thereof, it will be understood by those skilled in the art that various changes in form and details may be made therein without departing from the scope of the invention encompassed by the appended claims.

What is claimed is:

1. A bio sensitized photoelectric conversion device comprising: a stabilized protein-based sensitizer deposited on nanowires, semiconductor material, a cathode, an anode and a support wherein the protein-based sensitizer comprises photosystem I or photosystem II.

2. The photoelectric conversion device according to claim 1, wherein the stabilized protein-based sensitizer is photosystem I (PS-I) stabilized with surfactant peptides.

3. The photoelectric conversion device according to claim 2, wherein the surfactant peptides have a Formula selected from the group consisting of:

| Sequence (N → C) | Formula |
|---|---|
| $(\Phi)_m(+)_n$ | 1 |
| $(+)_n(\Phi)_m$ | 2 |
| $(\Phi)_m(-)_n$ | 3 |
| $(-)_n(\Phi)_m$ | 4 |
| $(-)_n(\Phi)_m(-)_n$ | 5 |
| $(+)_n(\Phi)_m(+)_n$ | 6 |
| $(\Phi)_m(-)n(\Phi)_m$ | 7 |
| $(\Phi)_m(+)n(\Phi)_m$ | 8 |
| $(+)_n(\Phi)_m(-)_n$ | 9 |
| $(-)_n(\Phi)_m(+)_n$ | 10 | wherein:
- ($\Phi$) represents independently for each occurrence a natural or non-natural amino acid comprising a hydrophobic sidechain;
- (+) represents independently for each occurrence a natural or non-natural amino acid comprising a sidechain that is cationic at physiological pH;
- (−) represents independently for each occurrence a natural or non-natural amino acid comprising a sidechain that is anionic at physiological pH;
- wherein the terminal amino acids are optionally substituted;
- m for each occurrence represents an integer greater than or equal to 5; and
- n for each occurrence represents an integer greater than or equal to 1.

4. The photoelectric conversion device according to claim 2, wherein the surfactant peptide is selected from the group consisting of

```
AAAAAAD,                       (SEQ ID NO.1)
VVVVVVD,                       (SEQ ID NO.2)
AAAAAADD,                      (SEQ ID NO.3)
VVVVVVDD,                      (SEQ ID NO.4)
LLLLLLDD,                      (SEQ ID NO.5)
KKIIIIII,                      (SEQ ID NO.6)
KKLLLLLL,                      (SEQ ID NO.7)
KKAAAAAA,                      (SEQ ID NO.8)
KKVVVVVV,                      (SEQ ID NO.9)
DDDDDDDDDDAAAAAAAAAA,          (SEQ ID NO.10)
AAAAAAAAAADDDDDDDDDD,          (SEQ ID NO.11)
EEEEEEEEEEAAAAAAAAAA,          (SEQ ID NO.12)
AAAAAAAAAAEEEEEEEEEE,          (SEQ ID NO.13)
DDDDDDDDDDVVVVVVVVVV,          (SEQ ID NO.14)
VVVVVVVVVVDDDDDDDDDD,          (SEQ ID NO.15)
DDDDDDDDDDPPPPPPPPPP,          (SEQ ID NO.16)
PPPPPPPPPPDDDDDDDDDD,          (SEQ ID NO.17)
AAAAAAAAAAHHHHHHHHHH,          (SEQ ID NO.18)
HHHHHHHHHHAAAAAAAAAA,          (SEQ ID NO.19)
KKKKKKKKKKAAAAAAAAAA,          (SEQ ID NO.20)
AAAAAAAAAAKKKKKKKKKK,          (SEQ ID NO.21)
RRRRRRRRRRAAAAAAAAAA,          (SEQ ID NO.22)
AAAAAAAAAARRRRRRRRRR,          (SEQ ID NO.23)
DDDDDDDDDDAAAAAAAAAADDDDDDDDDD, (SEQ ID NO.24)
EEEEEEEEEEAAAAAAAAAAEEEEEEEEEE, (SEQ ID NO.25)
DDDDDDDDDDVVVVVVVVVVDDDDDDDDDD, (SEQ ID NO.26)
DDDDDDDDDDPPPPPPPPPPDDDDDDDDDD, (SEQ ID NO.27)
HHHHHHHHHHAAAAAAAAAAHHHHHHHHHH, (SEQ ID NO.28)
KKKKKKKKKKAAAAAAAAAAKKKKKKKKKK, (SEQ ID NO.29)
RRRRRRRRRRAAAAAAAAAARRRRRRRRRR, (SEQ ID NO.30)
AAAAAAAAAADDDDDDDDDAAAAAAAAAA, (SEQ ID NO.31)
AAAAAAAAAAEEEEEEEEEEAAAAAAAAAA, (SEQ ID NO.32)
VVVVVVVVVVDDDDDDDDDDVVVVVVVVVV, (SEQ ID NO.33)
PPPPPPPPPPDDDDDDDDDDPPPPPPPPPP, (SEQ ID NO.34)
AAAAAAAAAAHHHHHHHHHHAAAAAAAAAA, (SEQ ID NO.35)
AAAAAAAAAAKKKKKKKKKKAAAAAAAAAA, (SEQ ID NO.36)
AAAAAAAAAARRRRRRRRRRAAAAAAAAAA, (SEQ ID NO.37)
KKKKKKKKKKAAAAAAAAAADDDDDDDDDD, (SEQ ID NO.38)
KKKKKKKKKKAAAAAAAAAAEEEEEEEEEE, (SEQ ID NO.39)
RRRRRRRRRRVVVVVVVVVVDDDDDDDDDD, (SEQ ID NO.40)
KKKKKKKKKKPPPPPPPPPPDDDDDDDDDD, (SEQ ID NO.41)
and
HHHHHHHHHHAAAAAAAAAAEEEEEEEEEE. (SEQ ID NO.42).
```

5. The photoelectric conversion device according to claim 2, wherein the surfactant peptide is AAAAAAK (SEQ ID NO. 47).

6. The photoelectric conversion device according to claim 2, wherein the said nanowires are selected from ZnO nanowires.

7. The photoelectric conversion device according to claim 1, wherein the semiconductor material is selected from ITO, Alq3, $Al_2O_3$, and $C_{60}$.

8. The photoelectric conversion device according to claim 1, wherein the cathode and anode comprise Au and Ag, respectively.

9. The photoelectric conversion device according to claim 1, wherein the support is a glass slide.

10. The photoelectric conversion device of claim 1, wherein the stabilized protein-based sensitizer comprises a ZnO-binding moiety and the nanowires comprise ZnO.

11. The photoelectric conversion device of claim 1, wherein the stabilized biologically protein-based sensitizer comprises a fusion protein comprising a ZnO-binding moiety attached to a biologically-derived sensitizer and the nanowires comprise ZnO.

12. The photoelectric conversion device of claim 2, wherein the stabilized biologically protein-based sensitizer comprises a fusion protein comprising a ZnO-binding moiety attached to a biologically-derived sensitizer and the nanowires comprise ZnO wherein the photosystem is oriented to deposit electrons to the ZnO nanowire.

13. The photoelectric conversion device of claim 2, wherein the stabilized protein-based sensitizer is isolated from plant tissue.

14. The photoelectric conversion device of claim 2, wherein the stabilized protein-based sensitizer is isolated from algae.

15. The photoelectric conversion device of claim 2, wherein the stabilized protein-based sensitizer is dry.

16. The photoelectric conversion device according to claim 3 wherein:
- ($\Phi$) is alanine, valine, leucine, isoleucine or proline;
- (+) is histidine, lysine or arginine; or
  - (−) is aspartic acid or glutamic acid.

* * * * *

SEQUENCE LISTING

<160> NUMBER OF SEQ ID NOS: 47

<210> SEQ ID NO 1
<211> LENGTH: 7

```
<212> TYPE: PRT
<213> ORGANISM: Artificial Sequence
<220> FEATURE:
<223> OTHER INFORMATION: Synthetic Peptide

<400> SEQUENCE: 1

Ala Ala Ala Ala Ala Ala Asp
 1               5

<210> SEQ ID NO 2
<211> LENGTH: 7
<212> TYPE: PRT
<213> ORGANISM: Artificial Sequence
<220> FEATURE:
<223> OTHER INFORMATION: Synthetic Peptide

<400> SEQUENCE: 2

Val Val Val Val Val Val Asp
 1               5

<210> SEQ ID NO 3
<211> LENGTH: 8
<212> TYPE: PRT
<213> ORGANISM: Artificial Sequence
<220> FEATURE:
<223> OTHER INFORMATION: Synthetic Peptide

<400> SEQUENCE: 3

Ala Ala Ala Ala Ala Ala Asp Asp
 1               5

<210> SEQ ID NO 4
<211> LENGTH: 8
<212> TYPE: PRT
<213> ORGANISM: Artificial Sequence
<220> FEATURE:
<223> OTHER INFORMATION: Synthetic Peptide

<400> SEQUENCE: 4

Val Val Val Val Val Val Asp Asp
 1               5

<210> SEQ ID NO 5
<211> LENGTH: 8
<212> TYPE: PRT
<213> ORGANISM: Artificial Sequence
<220> FEATURE:
<223> OTHER INFORMATION: Synthetic Peptide

<400> SEQUENCE: 5

Leu Leu Leu Leu Leu Leu Asp Asp
 1               5

<210> SEQ ID NO 6
<211> LENGTH: 8
<212> TYPE: PRT
<213> ORGANISM: Artificial Sequence
<220> FEATURE:
<223> OTHER INFORMATION: Synthetic Peptide

<400> SEQUENCE: 6

Lys Lys Ile Ile Ile Ile Ile Ile
 1               5

<210> SEQ ID NO 7
<211> LENGTH: 8
<212> TYPE: PRT
```

```
<213> ORGANISM: Artificial Sequence
<220> FEATURE:
<223> OTHER INFORMATION: Synthetic Peptide

<400> SEQUENCE: 7

Lys Lys Leu Leu Leu Leu Leu Leu
 1               5

<210> SEQ ID NO 8
<211> LENGTH: 9
<212> TYPE: PRT
<213> ORGANISM: Artificial Sequence
<220> FEATURE:
<223> OTHER INFORMATION: Synthetic Peptide

<400> SEQUENCE: 8

Lys Lys Ala Ala Ala Ala Ala Ala Ala
 1               5

<210> SEQ ID NO 9
<211> LENGTH: 8
<212> TYPE: PRT
<213> ORGANISM: Artificial Sequence
<220> FEATURE:
<223> OTHER INFORMATION: Synthetic Peptide

<400> SEQUENCE: 9

Lys Lys Val Val Val Val Val Val
 1               5

<210> SEQ ID NO 10
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 10

Asp Asp Asp Asp Asp Asp Asp Asp Asp Asp Ala Ala Ala Ala Ala
 1               5                  10                  15

Ala Ala Ala Ala
         20

<210> SEQ ID NO 11
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 11

Ala Ala Ala Ala Ala Ala Ala Ala Ala Ala Asp Asp Asp Asp Asp
 1               5                  10                  15

Asp Asp Asp Asp
         20

<210> SEQ ID NO 12
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 12

Glu Glu Glu Glu Glu Glu Glu Glu Glu Glu Ala Ala Ala Ala Ala
 1               5                  10                  15
```

Ala Ala Ala Ala
            20

<210> SEQ ID NO 13
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 13

Ala Ala Ala Ala Ala Ala Ala Ala Ala Ala Glu Glu Glu Glu Glu Glu
 1               5                  10                  15

Glu Glu Glu Glu
            20

<210> SEQ ID NO 14
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 14

Asp Asp Asp Asp Asp Asp Asp Asp Asp Asp Val Val Val Val Val Val
 1               5                  10                  15

Val Val Val Val
            20

<210> SEQ ID NO 15
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 15

Val Val Val Val Val Val Val Val Val Val Asp Asp Asp Asp Asp Asp
 1               5                  10                  15

Asp Asp Asp Asp
            20

<210> SEQ ID NO 16
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 16

Asp Asp Asp Asp Asp Asp Asp Asp Asp Asp Pro Pro Pro Pro Pro Pro
 1               5                  10                  15

Pro Pro Pro Pro
            20

<210> SEQ ID NO 17
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 17

Pro Pro Pro Pro Pro Pro Pro Pro Pro Pro Asp Asp Asp Asp Asp Asp

```
                  1               5                  10                 15
Asp Asp Asp Asp
         20

<210> SEQ ID NO 18
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 18

Ala Ala Ala Ala Ala Ala Ala Ala Ala Ala His His His His His His
  1               5                  10                 15

His His His His
         20

<210> SEQ ID NO 19
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 19

His His His His His His His His His His Ala Ala Ala Ala Ala Ala
  1               5                  10                 15

Ala Ala Ala Ala
         20

<210> SEQ ID NO 20
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 20

Lys Lys Lys Lys Lys Lys Lys Lys Lys Lys Ala Ala Ala Ala Ala Ala
  1               5                  10                 15

Ala Ala Ala Ala
         20

<210> SEQ ID NO 21
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 21

Ala Ala Ala Ala Ala Ala Ala Ala Ala Ala Lys Lys Lys Lys Lys Lys
  1               5                  10                 15

Lys Lys Lys Lys
         20

<210> SEQ ID NO 22
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 22
```

Arg Arg Arg Arg Arg Arg Arg Arg Arg Ala Ala Ala Ala Ala Ala
1               5                   10                  15

Ala Ala Ala Ala
            20

<210> SEQ ID NO 23
<211> LENGTH: 20
<212> TYPE: PRT
<213> ORGANISM: Artificial Sequence
<220> FEATURE:
<223> OTHER INFORMATION: Synthetic Peptide

<400> SEQUENCE: 23

Ala Ala Ala Ala Ala Ala Ala Ala Ala Arg Arg Arg Arg Arg Arg
1               5                   10                  15

Arg Arg Arg Arg
            20

<210> SEQ ID NO 24
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 24

Asp Asp Asp Asp Asp Asp Asp Asp Asp Ala Ala Ala Ala Ala Ala
1               5                   10                  15

Ala Ala Ala Ala Asp Asp Asp Asp Asp Asp Asp Asp Asp Asp
            20                  25                  30

<210> SEQ ID NO 25
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 25

Glu Glu Glu Glu Glu Glu Glu Glu Glu Ala Ala Ala Ala Ala Ala
1               5                   10                  15

Ala Ala Ala Ala Glu Glu Glu Glu Glu Glu Glu Glu Glu Glu
            20                  25                  30

<210> SEQ ID NO 26
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 26

Asp Asp Asp Asp Asp Asp Asp Asp Asp Val Val Val Val Val Val
1               5                   10                  15

Val Val Val Val Asp Asp Asp Asp Asp Asp Asp Asp Asp Asp
            20                  25                  30

<210> SEQ ID NO 27
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 27

```
Asp Asp Asp Asp Asp Asp Asp Asp Asp Pro Pro Pro Pro Pro
1               5                   10                  15

Pro Pro Pro Pro Asp Asp Asp Asp Asp Asp Asp Asp
            20              25              30
```

<210> SEQ ID NO 28
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 28

```
His His His His His His His His His Ala Ala Ala Ala Ala
1               5                   10                  15

Ala Ala Ala Ala His His His His His His His His
            20              25              30
```

<210> SEQ ID NO 29
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 29

```
Lys Lys Lys Lys Lys Lys Lys Lys Lys Ala Ala Ala Ala Ala
1               5                   10                  15

Ala Ala Ala Ala Lys Lys Lys Lys Lys Lys Lys Lys
            20              25              30
```

<210> SEQ ID NO 30
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 30

```
Arg Arg Arg Arg Arg Arg Arg Arg Arg Ala Ala Ala Ala Ala
1               5                   10                  15

Ala Ala Ala Ala Arg Arg Arg Arg Arg Arg Arg Arg
            20              25              30
```

<210> SEQ ID NO 31
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 31

```
Ala Ala Ala Ala Ala Ala Ala Ala Ala Ala Asp Asp Asp Asp Asp
1               5                   10                  15

Asp Asp Asp Asp Ala Ala Ala Ala Ala Ala Ala Ala Ala
            20              25              30
```

<210> SEQ ID NO 32
<211> LENGTH: 30
<212> TYPE: PRT
<213> ORGANISM: Artificial Sequence
<220> FEATURE:
<223> OTHER INFORMATION: Synthetic Peptide

```
<400> SEQUENCE: 32

Ala Ala Ala Ala Ala Ala Ala Ala Ala Ala Glu Glu Glu Glu Glu
1               5                   10                  15

Glu Glu Glu Glu Ala Ala Ala Ala Ala Ala Ala Ala Ala Ala
                20                  25                  30

<210> SEQ ID NO 33
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 33

Val Val Val Val Val Val Val Val Val Val Asp Asp Asp Asp Asp
1               5                   10                  15

Asp Asp Asp Asp Val Val Val Val Val Val Val Val Val Val
                20                  25                  30

<210> SEQ ID NO 34
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 34

Pro Pro Pro Pro Pro Pro Pro Pro Pro Pro Asp Asp Asp Asp Asp
1               5                   10                  15

Asp Asp Asp Asp Pro Pro Pro Pro Pro Pro Pro Pro Pro Pro
                20                  25                  30

<210> SEQ ID NO 35
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 35

Ala Ala Ala Ala Ala Ala Ala Ala Ala Ala His His His His His
1               5                   10                  15

His His His His Ala Ala Ala Ala Ala Ala Ala Ala Ala Ala
                20                  25                  30

<210> SEQ ID NO 36
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 36

Ala Ala Ala Ala Ala Ala Ala Ala Ala Ala Lys Lys Lys Lys Lys
1               5                   10                  15

Lys Lys Lys Lys Ala Ala Ala Ala Ala Ala Ala Ala Ala Ala
                20                  25                  30

<210> SEQ ID NO 37
<211> LENGTH: 30
<212> TYPE: PRT
<213> ORGANISM: Artificial Sequence
<220> FEATURE:
<223> OTHER INFORMATION: Synthetic Peptide
```

```
<400> SEQUENCE: 37

Ala Ala Ala Ala Ala Ala Ala Ala Ala Arg Arg Arg Arg Arg Arg
1               5                   10                  15

Arg Arg Arg Arg Ala Ala Ala Ala Ala Ala Ala Ala Ala Ala Ala
                20                  25                  30

<210> SEQ ID NO 38
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 38

Lys Lys Lys Lys Lys Lys Lys Lys Lys Lys Ala Ala Ala Ala Ala
1               5                   10                  15

Ala Ala Ala Ala Asp Asp Asp Asp Asp Asp Asp Asp Asp Asp
                20                  25                  30

<210> SEQ ID NO 39
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 39

Lys Lys Lys Lys Lys Lys Lys Lys Lys Lys Ala Ala Ala Ala Ala
1               5                   10                  15

Ala Ala Ala Ala Glu Glu Glu Glu Glu Glu Glu Glu Glu Glu
                20                  25                  30

<210> SEQ ID NO 40
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 40

Arg Arg Arg Arg Arg Arg Arg Arg Arg Arg Val Val Val Val Val
1               5                   10                  15

Val Val Val Val Asp Asp Asp Asp Asp Asp Asp Asp Asp Asp
                20                  25                  30

<210> SEQ ID NO 41
<211> LENGTH: 30
<212> TYPE: PRT
<213> ORGANISM: Artificial Sequence
<220> FEATURE:
<223> OTHER INFORMATION: Synthetic Peptide

<400> SEQUENCE: 41

Lys Lys Lys Lys Lys Lys Lys Lys Lys Lys Pro Pro Pro Pro Pro
1               5                   10                  15

Pro Pro Pro Pro Asp Asp Asp Asp Asp Asp Asp Asp Asp Asp
                20                  25                  30

<210> SEQ ID NO 42
<211> LENGTH: 30
<212> TYPE: PRT
<213> ORGANISM: Artificial Sequence
<220> FEATURE:
```

```
<223> OTHER INFORMATION: Synthetic Peptide

<400> SEQUENCE: 42

His His His His His His His His Ala Ala Ala Ala Ala Ala Ala Ala
1               5                   10                  15

Ala Ala Ala Ala Glu Glu Glu Glu Glu Glu Glu Glu Glu Glu
            20                  25                  30

<210> SEQ ID NO 43
<211> LENGTH: 24
<212> TYPE: PRT
<213> ORGANISM: Artificial Sequence
<220> FEATURE:
<223> OTHER INFORMATION: Synthetic Peptide

<400> SEQUENCE: 43

Arg Ser Asn Thr Arg Met Thr Ala Arg Gln His Arg Ser Ala Asn His
1               5                   10                  15

Lys Ser Thr Gln Arg Ala Arg Ser
            20

<210> SEQ ID NO 44
<211> LENGTH: 9
<212> TYPE: PRT
<213> ORGANISM: Artificial Sequence
<220> FEATURE:
<223> OTHER INFORMATION: Synthetic Peptide

<400> SEQUENCE: 44

Gly Leu His Ile Pro Thr Ser His Arg
1               5

<210> SEQ ID NO 45
<211> LENGTH: 12
<212> TYPE: PRT
<213> ORGANISM: Artificial Sequence
<220> FEATURE:
<223> OTHER INFORMATION: Synthetic Peptide

<400> SEQUENCE: 45

Glu Ala His Val Met His Lys Val Ala Pro Arg Pro
1               5                   10

<210> SEQ ID NO 46
<211> LENGTH: 12
<212> TYPE: PRT
<213> ORGANISM: Artificial Sequence
<220> FEATURE:
<223> OTHER INFORMATION: Synthetic Peptide

<400> SEQUENCE: 46

Arg Ile Gly His Gly Arg Gln Ile Arg Lys Pro Leu
1               5                   10

<210> SEQ ID NO 47
<211> LENGTH: 7
<212> TYPE: PRT
<213> ORGANISM: Artificial Sequence
<220> FEATURE:
<223> OTHER INFORMATION: Synthetic Peptide

<400> SEQUENCE: 47

Ala Ala Ala Ala Ala Ala Lys
1               5
```